US012787194B2

(12) United States Patent
Slyusarenko et al.

(10) Patent No.: US 12,787,194 B2
(45) Date of Patent: Nov. 3, 2026

(54) SPHERICAL MODULAR VIDEO SCREEN AND DEVICE FOR DISPLAYING A VIDEO SEQUENCE

(71) Applicants: Vitaliy Serhiiovych Slyusarenko, Kyiv (UA); Igor Ivanovych Pastukh, Zhytomyr (UA)

(72) Inventors: Vitaliy Serhiiovych Slyusarenko, Kyiv (UA); Igor Ivanovych Pastukh, Zhytomyr (UA); Volodymyr Volodymyrovych Ulakhovych, Donetsk (UA); Andriy Anatoliyovych Yamkovyy, Kyiv (UA)

( * ) Notice: Subject to any disclaimer, the term of this patent is extended or adjusted under 35 U.S.C. 154(b) by 111 days.

(21) Appl. No.: 18/867,957

(22) PCT Filed: May 18, 2023

(86) PCT No.: PCT/UA2023/000023
§ 371 (c)(1),
(2) Date: Nov. 21, 2024

(87) PCT Pub. No.: WO2023/234911
PCT Pub. Date: Dec. 7, 2023

(65) Prior Publication Data

US 2025/0324528 A1 Oct. 16, 2025

(30) Foreign Application Priority Data

May 31, 2022 (UA) .............................. a 2022 01835

(51) Int. Cl.
*H05K 5/30* (2025.01)

(52) U.S. Cl.
CPC .................................... *H05K 5/30* (2025.01)

(58) Field of Classification Search
CPC ........................................................ H05K 5/30
See application file for complete search history.

(56) References Cited

U.S. PATENT DOCUMENTS 2,918,992 A * 12/1959 Gelsavage ........... E04B 1/3211 52/762
4,422,267 A * 12/1983 Whitehouse .......... E04B 1/3211 D25/13

(Continued)

*Primary Examiner* — David Tung
(74) *Attorney, Agent, or Firm* — Kilpatrick Townsend & Stockton LLP; Vanessa Bell; Joe C. Hao

(57) ABSTRACT

The disclosed technical solution relates to the development of surfaces that are display screens on which an image or a video sequence are presented on a curved surface, in particular, on a surface resembling a spherical one. The foundation of the claimed invention lies in the objective of creating a spherical modular video screen, which is formed by a limited number of types of unique elements, where the number of types of unique elements is clearly defined, and the size of the spherical modular video screen can be altered by adding or removing said elements. This provides a design of a device for displaying a visual sequence that allows for adjustment of the spherical modular video screen's radius according to a predetermined step. The technical result attained by implementing the spherical modular video screen is the reduction in the number of unique element types constituting the spherical modular video screen. The specified novel attribute is achieved through the implementation of an innovative construction principle.

9 Claims, 10 Drawing Sheets

(56) References Cited

U.S. PATENT DOCUMENTS

| | | | | |
|---|---|---|---|---|
| 5,926,153 | A * | 7/1999 | Ohishi | G09B 9/32<br>345/1.3 |
| 2003/0194683 | A1 * | 10/2003 | Vorst | G09B 9/326<br>434/38 |
| 2015/0161922 | A1 * | 6/2015 | Szyman | B31D 5/0086<br>40/538 |
| 2018/0121153 | A1 * | 5/2018 | Lee | G09G 3/003 |

* cited by examiner

SPHERICAL MODULAR VIDEO SCREEN AND DEVICE FOR DISPLAYING A VIDEO SEQUENCE

TECHNICAL FIELD

The disclosed technical solution pertains to the development of display screens on which images or video are projected onto curved surfaces, specifically those resembling a spherical surface. More specifically, the invention relates to dome-shaped screens composed of flat modules for image playback and their construction.

PRIOR ART

A known technical solution from the prior art is the U.S. Pat. No. 6,295,785 (B1) dated Oct. 2, 2001, which discloses a method for constructing a geodesic dome that comprises the steps of:

(a) generating a mathematical model of a geodesic dome, the method comprising the steps of:

(1) generating M base triangles in the form of a closed three-dimensional shape, each base triangle existing in a plane, M being a positive integer greater than three;

(2) defining a center point within the closed three-dimensional shape, the center point being equidistant from each of the vertices of each of the base triangles;

(3) defining a geodesic radius as the distance between the center point and any of the vertices of any of the base triangles;

(4) subdividing each leg of each of the base triangles into N segments of equal length, N being a positive integer greater than one, thus defining N+1 intersections along each leg of each of the base triangles;

(5) connecting each intersection defined in step (4) to two corresponding intersections within the same base triangle, thus generating N2 smaller triangles within each base triangle;

(6) generating an interior line between each vertex of each of the smaller triangles and the center point;

(7) extending each of the interior lines generated in step (6) through the plane of the base triangle in which the smaller triangle exists until each of the interior lines as extended outside the base triangle is the same length as the geodesic radius, each extended line terminating in an endpoint opposite the center point; and (8) connecting each endpoint defined in step (7) to each other endpoint generated in step (7) adjacent to the line end by an exterior line, thus generating a substantially curved surface comprising N2*M triangles, the substantially curved surface defining a mathematical model of a geodesic dome;

(b) fabricating a plurality of components with which to form a geodesic dome according to the model; and (c) fastening the components to each other according to the model.

This technical solution provides for the possibility of building a geodesic dome based on triangular modules. However, this solution does not propose specific solutions for building a spherical modular video screen based on modules. The application of the above technical solution to create a dome allowed for the determination of a certain algorithm for determining the dimensions and quantity of components of the structure.

The trend of using modules to implement spherical modular video screens was further developed in the solution described in document CN106601140 (A), which discloses the structure of a spherical modular video screen. According to this known solution, a spherical modular video screen is formed by constructing and combining a set of trapezoidal LED panels. Playing back a video or displaying an image on a spherical dome video screen can be done on the outer or inner surface of the spherical modular video screen.

The disadvantage of the known solution is the complexity of the structure, which is manifested in the need to carry out precise assembly and installation of a large number of components.

Technical Objective

The main task of the claimed invention is to create a spherical modular video screen using elements with a limited and fixed number of unique types, and the change in the radius of the spherical modular video screen is achieved by using a different total number of elements while maintaining the same number of unique types of these elements. Solving this problem provides the ability to create a device for displaying a visual sequence, the size of the modular spherical video screen which can vary according to the specified step of changing its radius.

Thesaurus

Device for displaying a visual sequence—a complex for displaying a photo and/or video sequence. One example of such a complex is a planetarium.

Spherical modular video screen—a construction that approximates a sphere or its part, such as a hemisphere, quarter of a sphere, or another part of a sphere, composed of video modules and designed for displaying a photo and/or video sequence. This technical solution includes embodiments in which the photo and/or video sequence can be displayed on the outer or inner surface of the spherical modular video screen.

Video module—an element of a spherical modular video screen designed to display a certain fragment of a photo and/or video sequence, divided into fragments. The display is performed by the presence of a series/set of elements for displaying a photo and/or video sequence, such as LEDs or other similar purpose elements or constructions, the essence of which is not the subject of this invention, on one of the surfaces of the video module.

Remote vertex—a vertex of a video module that lies on the surface approximating a sphere and coincides with the vertex of the projection of this video module onto the plane. The remote vertex is characterized by the fact that it does not change its position in space when forming a spatial construction from a planar one.

Projection onto a plane—a projection of a planar or spatial construction onto an imaginary plane, where the projection is performed using mutually parallel rays perpendicular to the plane onto which the projection is made.

Projection onto a sphere surface—a projection of a planar construction where the projection is performed using rays that share a common starting point which is the center of the sphere.

SHORT DESCRIPTION OF THE INVENTION

The given problem is solved by means of a spherical modular video screen containing a set of video modules connected on the frame, where the set of specified video modules includes the first and second types of video modules, according to the technical solution, the first type of video modules is a subPENTA video module, and the second type of video modules is a subHEXA video module, where each of the video modules is designed to approximate a part of the surface of a sphere described around a spherical modular video screen, and the subPENTA video modules form a set of a predetermined number of subPENTA video modules to form the spatial structure of the bigPENTA video module, the projection of which on the plane is characterized by a triangular shape, and each subPENTA video module is located in space in such a way that the vertices of each subPENTA video module lie on the surface of the approximated sphere and to approximate the part of the sphere surface that corresponds to the projection of the subPENTA video module onto the approximated sphere surface, where the projection of the bigPENTA video module onto the plane is characterized by a triangular shape with two equal lateral sides and a base, and such projections of five bigPENTA video modules, characterized by a triangular shape, connected to each other by lateral sides to form the lateral surface of a regular right pyramid, at the base of which is a regular pentagon, which consists of the five bases of the above projections of the bigPENTA video modules, and all the vertices of the specified pyramid lie on the surface of the approximated sphere, and the subHEXA video modules form a set of a predetermined number of subHEXA video modules to form the spatial structure of the bigHEXA video module, the projection of which on the plane is characterized by a triangular shape, and each subHEXA video module is located in space in such a way that the vertices of each subHEXA video module lie on the surface of the approximated sphere and to approximate the part of the sphere surface that corresponds to the projection of the subHEXA video module onto the surface of the approximated sphere, where the projection of the bigHEXA video module onto the plane is characterized by a triangular shape with two equal lateral sides and a base, and such projections of six bigHEXA video modules, characterized by a triangular shape, connected to each other by the lateral sides to form the lateral surface of a regular right pyramid, at the base of which is a regular hexagon, which consists of the six bases of the above projections of bigHEXA video modules, and all the vertices of the specified pyramid lie on the surface of the approximated sphere, and each of at least one subPENTA video module and each of at least one subHEXA video module on at least one of its surfaces contains at least one element for playing a video image, in addition, at least one bigHEXA video module and at least one bigPENTA video module are aligned with each other by their bases.

According to the technical solution, each subPENTA video module contains a set of identical modPENTA video modules, each of which is characterized by a triangular shape, and the vertices of the modPENTA video modules lie on the surface of the approximated sphere, and the specified modPENTA video modules are mutually located in space in such a way as to approximate a part of the surface of the sphere, which corresponds to the projection of the subPENTA video module onto the approximated sphere surface, and each subHEXA video module contains a set of identical modHEXA video modules, each of which is characterized by a triangular shape, with the vertices of the modHEXA video modules lying on the surface of the approximated sphere, and the specified modHEXA video modules are mutually located in space in such a way as to approximate a part of the surface of the sphere, which corresponds to the projection of the subHEXA video module onto the approximated sphere surface.

According to the technical solution, the bigPENTA video module contains at least 4 interconnected subPENTA video modules, the projection on the plane of each of which is characterized by a triangular shape, where each subPENTA video module has the first, second and third sides, and when the specified subPENTA video modules are combined, the resulting structure is characterized by a projection on the plane that coincides with the projection of the bigPENTA video module onto the same plane characterized by the first, second and third sides, and the bigHEXA video module contains at least 4 interconnected subHEXA video modules, the projection on the plane of each of which is characterized by a triangular shape, where each subHEXA video module has the first, second and third sides connected to each other, and when the specified video modules are combined, the resulting structure is characterized by a projection on a plane that coincides with the projection of the bigHEXA video module onto the same plane characterized by the first, second and third sides.

According to the technical solution, the bigPENTA video module contains at least 9 subPENTA video modules, and the projection of each on the plane is characterized by a triangular shape, where the specified 9 subPENTA video modules are characterized as subPENTA video modules of the 1st type, the first and second of the 2nd type, the first, the second and the third of the 3rd type, the first and second of the 4th type and the 5th type, where each subPENTA video module has first, second and third sides connected to each other, and when the specified subPENTA video modules are combined, the resulting structure is characterized by a projection onto a plane that coincides with the projection of the bigPENTA video module onto the same plane, characterized by the first, second and third sides, where 9 subPENTA video modules are connected to each other on the projection as follows:

the third side of the projection of the first subPENTA video module of the 3rd type borders the third side of the projection of the second subPENTA video module of the 3rd type, and the first and second sides of the projection of the first subPENTA video module of the 3rd type at least partially coincide with the projections of the first and second sides of the bigPENTA video module, the first side of the projection of the second subPENTA video module of the 3rd type borders the second side of the projection of the first subPENTA video module of the 4th type, and the second side of the projection of the second subPENTA video module of the 3rd type borders the first side of the projection of the first subPENTA video module of the 2nd type, and the first side of the projection of the first subPENTA video module of the 4th type at least partially coincides with the first side of the projection of the bigPENTA video module, the second side of the projection of the first subPENTA video module of the 2nd type at least partially coincides with the second side of the bigPENTA video module, the third side of the projection of the first subPENTA video module of the 4th type borders the third side of the projection of the second subPENTA video module of the 2nd type, and the third side of the projection of the first subPENTA video module of the 2nd type borders the third side of the projection of the second subPENTA video module of the 4th type, the first side of the projection of the subPENTA video module of the 1st type at least partially coincides with the first side of the projection of the bigPENTA video module, the third side of the projection of the subPENTA video module of the 1st type at least partially coincides with the third side of the projection of the bigPENTA video module, the second side of the projection of the subPENTA video module of the 1st type borders the first side of the projection of the second subPENTA video module of the 2nd type, the second side of the projection of the second subPENTA video module of the 2nd type borders the first side of the projection of the third subPENTA video module of the 3rd type, the second side of the projection of the third subPENTA video module of the 3rd type borders the first side of the projection of the second subPENTA video module of the 4th type, the third side of the projection of the third subPENTA video module of the 3rd type at least partially coincides with the third side of the bigPENTA video module, the second side of the projection of the second subPENTA video module of the 4th type borders the first side of the projection of the subPENTA video module of the 5th type, the second side of the projection of the subPENTA video module of the 5th type at least partially coincides with the second side of the projection of the bigPENTA video module, the third side of the projection of the subPENTA video module of the 5th type at least partially coincides with the third side of the projection of the bigPENTA video module, and the bigHEXA video module contains at least 9 subHEXA video modules, the projection of each on the plane is characterized by a triangular shape, where the specified 9 subHEXA video modules are characterized as subHEXA video modules of the 1st type, the first and second of the 2nd type, the first, the second and the third of the 3rd type, the first and second of the 4th type and the 5th type, where each subHEXA video module has first, second and third sides connected to each other, and when the specified subHEXA video modules are combined, the resulting structure is characterized by a projection onto a plane that coincides with the projection of the bigHEXA video module onto the same plane, characterized by the first, second and third sides, where 9 subHEXA video modules are connected to each other on the projection as follows:

the third side of the projection of the first subHEXA video module of the 3rd type borders the third side of the projection of the second subHEXA video module of the 3rd type, and the first and second sides of the projection of the first subHEXA video module of the 3rd type at least partially coincide with the projections of the first and second sides of the bigHEXA video module, the first side of the projection of the second subHEXA video module of the 3rd type borders the second side of the projection of the first subHEXA video module of the 4th type, and the second side of the projection of the second subHEXA video module of the 3rd type borders the first side of the projection of the first subHEXA video module of the 2nd type, and the first side of the projection of the first subHEXA video module of the 4th type at least partially coincides with the first side of the projection of the bigHEXA video module, the second side of the projection of the first subHEXA video module of the 2nd type at least partially coincides with the second side of the bigHEXA video module, the third side of the projection of the first subHEXA video module of the 4th type borders the third side of the projection of the second subHEXA video module of the 2nd type, and the third side of the projection of the first subHEXA video module of the 2nd type borders the third side of the projection of the second subHEXA video module of the 4th type, the first side of the projection of the subHEXA video module of the 1st type at least partially coincides with the first side of the projection of the bigHEXA video module, the third side of the projection of the subHEXA video module of the 1st type at least partially coincides with the third side of the projection of the bigHEXA video module, the second side of the projection of the subHEXA video module of the 1st type borders the first side of the projection of the second subHEXA video module of the 2nd type, the second side of the projection of the second subHEXA video module of the 2nd type borders the first side of the projection of the third subHEXA video module of the 3rd type, the second side of the projection of the third subHEXA video module of the 3rd type borders the first side of the projection of the second subHEXA video module of the 4th type, the third side of the projection of the third subHEXA video module of the 3rd type at least partially coincides with the third side of the bigHEXA video module, the second side of the projection of the second subHEXA video module of the 4th type borders the first side of the projection of the subHEXA video module of the 5th type, the second side of the projection of the subHEXA video module of the 5th type at least partially coincides with the second side of the projection of the bigHEXA video module, the third side of the projection of the subHEXA video module of the 5th type at least partially coincides with the third side of the projection of the bigHEXA video module.

According to the technical solution, the subPENTA video module of the 1st type contains at least 4 modPENTA video modules of the 1st type of the same size, the subPENTA video module of the 2nd type contains at least 4 modPENTA video modules of the 2nd type of the same size, the subPENTA video module of the 3rd type contains at least 4 modPENTA video modules of the 3rd type of the same size, the subPENTA video module of the 4th type contains at least 4 modPENTA video modules of the 4th type of the same size, the subPENTA video module of the 5th type contains at least 4 modPENTA video modules of the 5th type of the same size, and the subHEXA video module of the 1st type contains at least 4 modHEXA video modules of the 1st type of the same size, the subHEXA video module of the 2nd type contains at least 4 modHEXA video modules of the 2nd type of the same size, the subHEXA video module of the 3rd type contains at least 4 modHEXA video modules of the 3rd type of the same size, the subHEXA video module of the 4th type contains at least 4 modHEXA video modules of the 4th type of the same size, the subHEXA video module of the 5th type contains at least 4 modHEXA video modules of the 5th type of the same size.

According to the technical solution, increasing the screen size is achieved by simultaneously adding to the subPENTA video module of the 1st type of modPENTA video modules of the 1st type of the same size, to the subPENTA video module of the 2nd type of modPENTA video modules of the 2nd type of the same size, to the subPENTA video module of the 3rd type of modPENTA video modules of the 3rd type of the same size, to the subPENTA video module of the 4th type of modPENTA video modules of the 4th type of the same size, to the subPENTA video module of the 5th type of modPENTA video modules of the 5th type of the same size, to the subHEXA video module of the 1st type of modHEXA video modules of the 1st type of the same size, to the subHEXA video module of the 2nd type of modHEXA video modules of the 2nd type of the same size, to the subHEXA video module of the 3rd type of modHEXA video modules of the 3rd type of the same size, to the subHEXA video module of the 4th type of modHEXA video modules of the 4th type of the same size, to the subHEXA video module of the 5th type of modHEXA video modules of the 5th type of the same size, where the addition is performed according to the formula:

$$Snext=(N+1)^2-N^2, \quad (1)$$

where N is an integer representing the degree of subdivision for subPENTA or subHEXA video modules, where $N=\sqrt{Scur}$ (2).

Since a subPENTA video module consists only of identical modPENTA video modules of the corresponding type, and a subHEXA video module consists only of identical modHEXA video modules of the corresponding type, then Scur represents the number of modPENTA video modules in any subPENTA video module or the number of modHEXA video modules in any subHEXA video module for the corresponding degree of subdivision.

Snext is the number of modPENTA or modHEXA modules that are required to be added to each corresponding subPENTA or subHEXA video module of a video screen with the degree of subdivision N, in order to obtain the next size of a spherical modular video screen, corresponding to the next degree of subdivision N.

A spherical modular video screen that contains a plurality of video modules that are mounted on a frame, where, according to the technical solution, a set of video modules includes at least 4 subPENTA video modules, each of which is characterized by a triangular shape and approximates a part of the surface of the sphere, which is determined by its three remote vertices, which lie on the surface of the approximated sphere, and the specified at least 4 subPENTA video modules are combined to form a bigPENTA video module, which is characterized by a triangular shape, where the part of the sphere approximated by the bigPENTA video module formed is defined by its three remote vertices that lie on the surface of this sphere and which coincide with the three remote vertices of the combined subPENTA video modules, where the specified at least 4 subPENTA video modules are combined into a bigPENTA video module, the vertices of which lie on the surface of the approximated sphere, at least 4 subHEXA video modules, each of which is characterized by a triangular shape and approximates a part of the surface of the sphere, which is determined by its three remote vertices, which lie on the surface of the approximated sphere, and the specified at least 4 subHEXA video modules are combined to form a bigHEXA video module, which is characterized by a triangular shape, where the part of the sphere approximated by the formed bigHEXA video module is determined by its three remote vertices, which lie on the surface of this sphere and which coincide with the three remote vertices of the combined subHEXA video modules, where the specified at least 4 subHEXA video modules are combined into a bigHEXA video module, the vertices of which lie on the surface of the approximated sphere.

According to the technical solution, six bigHEXA video modules are formed with the possibility of combining with each other in such a way that six of their corresponding remote vertices are combined at one point, and each of the other two remote vertices of each bigHEXA video module is combined with a remote vertex of another adjacent bigHEXA video module, and the five bigPENTA video modules are formed with the possibility of combining with each other in such a way that their five corresponding remote vertices are combined at one point, and each of the other two remote vertices of each bigPENTA video module is combined with the remote vertex of another adjacent bigPENTA video module, in addition, at least one bigHEXA video module and at least one bigPENTA video module are adjacently connected on the frame.

A spherical modular video screen that contains a plurality of video modules that are mounted on a frame, where, according to the technical solution, a set of video modules includes at least 9 subPENTA video modules, each of which is characterized by a triangular shape and approximates a part of the surface of the sphere, defined by its three remote vertices, which lie on the surface of the approximated sphere, and the specified at least 9 subPENTA video modules are combined to form a bigPENTA video module, which is characterized by a triangular shape, where the part of the sphere approximated by the generated bigPENTA video module is determined by its three remote vertices that lie on the surface of this sphere and which coincide with the three remote vertices of the combined subPENTA video modules, where the subPENTA video modules are divided into 5 types, and each type is characterized by the same dimensions within the type, where the specified at least 9 subPENTA video modules are combined into a bigPENTA video module, the vertices of which lie on the surface of the approximated sphere, and the five bigPENTA video modules are made with the possibility of combining with each other in such a way that five of their respective remote vertices are combined at one point, and each of the other two remote vertices of each bigPENTA video module is combined with a remote vertex of another adjacent bigPENTA video module, at least 9 subHEXA video modules, each of which is characterized by a triangular shape and approximates a part of the surface of the sphere, defined by its three remote vertices, which lie on the surface of the approximated sphere, and the specified at least 9 subHEXA video modules are combined to form a bigHEXA video module, which is characterized by a triangular shape, where the part of the sphere approximated by the generated bigHEXA video module is determined by its three remote vertices, which lie on the surface of this sphere and which coincide with the three remote vertices of the combined subHEXA video modules, where the subHEXA video modules are divided into 5 types, and each type is characterized by the same dimensions within the type, where the specified at least 9 video modules are combined into a bigHEXA video module, the vertices of which lie on the surface of the approximated sphere, and the six bigHEXA video modules are made with the possibility of combining with each other in such a way that six of their respective remote vertices are combined at one point, and each of the other two remote vertices of each bigHEXA video module combined with a remote vertex of another adjacent bigHEXA video module, in addition, at least one bigHEXA video module and at least one bigPENTA video module are adjacently connected on the frame.

A spherical modular video screen that contains a plurality of video modules that are mounted on a frame, where, according to the technical solution, a set of video modules includes at least 4 modPENTA video modules, each of which is characterized by a triangular shape and approximates a part of the surface of the sphere, which is determined by its three remote vertices, which lie on the surface of the approximated sphere, and the specified at least 4 modPENTA video modules are combined to form a subPENTA video module, which is characterized by a triangular shape, where the part of the sphere approximated by the generated subPENTA video module is determined by its three remote vertices that lie on the surface of this sphere and which coincide with the three remote vertices of the combined modPENTA video modules, and the spherical modular video screen is made with the possibility of simultaneously increasing the number of modPENTA video modules in each of the subPENTA video modules while preserving the proportions of the sides of the subPENTA video module in such a way that the three remote vertices of the subPENTA video module coincide with the three remote vertices of the combined modPENTA video modules, at least 9 subPENTA video modules, each of which is characterized by a triangular shape and approximates a part of the surface of the sphere, defined by its three remote vertices, which lie on the surface of the approximated sphere, and the specified at least 9 subPENTA video modules are combined to form a bigPENTA video module, which is characterized by a triangular shape, where the part of the sphere approximated by the generated bigPENTA video module is determined by its three remote vertices that lie on the surface of this sphere and which coincide with the three remote vertices of the combined subPENTA video modules, where the subPENTA video modules are divided into 5 types, and each type is characterized by the same dimensions within the type, where the specified at least 9 subPENTA video modules are combined into a bigPENTA video module, the vertices of which lie on the surface of the approximated sphere, and the five bigPENTA video modules are made with the possibility of combining with each other in such a way that five of their respective remote vertices are combined at one point, and each of the other two remote vertices of each bigPENTA video module is combined with a remote vertex of another adjacent bigPENTA video module, at least 4 modHEXA video modules, each of which is characterized by a triangular shape and approximates a part of the surface of the sphere, defined by its three remote vertices, which lie on the surface of the approximated sphere, and said at least 4 modHEXA video modules are combined to form a subHEXA video module, which is characterized by a triangular shape, where the part of the sphere approximated by the generated subHEXA video module is determined by its three remote vertices, which lie on the surface of this sphere and which coincide with the three remote vertices of the combined modHEXA video modules, and the spherical modular video screen is made with the possibility of simultaneously increasing the number of modHEXA video modules in each of the subHEXA video modules while preserving the proportions of the sides of the subHEXA video module in such a way that the three remote vertices of the subHEXA video module coincide with the three remote vertices of the combined modHEXA video modules, at least 9 subHEXA video modules, each of which is characterized by a triangular shape and approximates a part of the surface of the sphere, defined by its three remote vertices, which lie on the surface of the approximated sphere, and the specified at least 9 subHEXA video modules are combined to form a bigHEXA video module, which is characterized by a triangular shape, where the part of the sphere approximated by the generated bigHEXA video module is determined by its three remote vertices, which lie on the surface of this sphere and which coincide with the three remote vertices of the combined subHEXA video modules, where the subHEXA video modules are divided into 5 types, and each type is characterized by the same dimensions within the type, where the specified 9 subHEXA video modules are combined into a bigHEXA video module, the vertices of which lie on the surface of the approximated sphere, and the six bigHEXA video modules are made with the possibility of combining with each other in such a way that six of their corresponding remote vertices are combined at one point, and each of the other two remote vertices of each bigHEXA video module combined with a remote vertex of another adjacent bigHEXA video module, in addition, at least one bigHEXA video module and at least one bigPENTA video module are adjacently connected on the frame.

The device for displaying a video sequence, according to the technical solution, contains a spherical modular video screen according to any of the previous items, the frame on which at least one bigHEXA video module and at least one bigPENTA video module of the spherical modular video screen are mounted, a set of elements for displaying a video sequence, connected to the specified at least one bigHEXA video module and at least one bigPENTA video module of a spherical modular video screen.

According to the technical solution, a part of the spherical surface approximated by five bigPENTA video modules is bordered on the frame by five parts of a spherical surface, each of which is approximated by six bigHEXA video modules.

Technical Result

The technical result achieved by implementing the spherical modular video screen is the reduction of the number of unique types of elements that make up the spherical modular video screen. This new feature is achieved through a new construction principle.

The technical result achieved by implementing the device for displaying a video sequence is the improvement of the characteristics of the device for displaying a video sequence due to its structural features. In particular, the installation time is reduced by using a limited number of unique components of the spherical modular video screen.

BRIEF DESCRIPTION OF DRAWINGS

The invention is further detailed with the help of accompanying drawings. These drawings are intended to illustrate the essence of the invention and are not meant to limit the potential embodiments. Instead, further improvements of the invention should be clear to a skilled person in the field, taking into account the provided drawings and their explanations in the subsequent description.

DETAILED DESCRIPTION OF THE INVENTION

Figure 1:
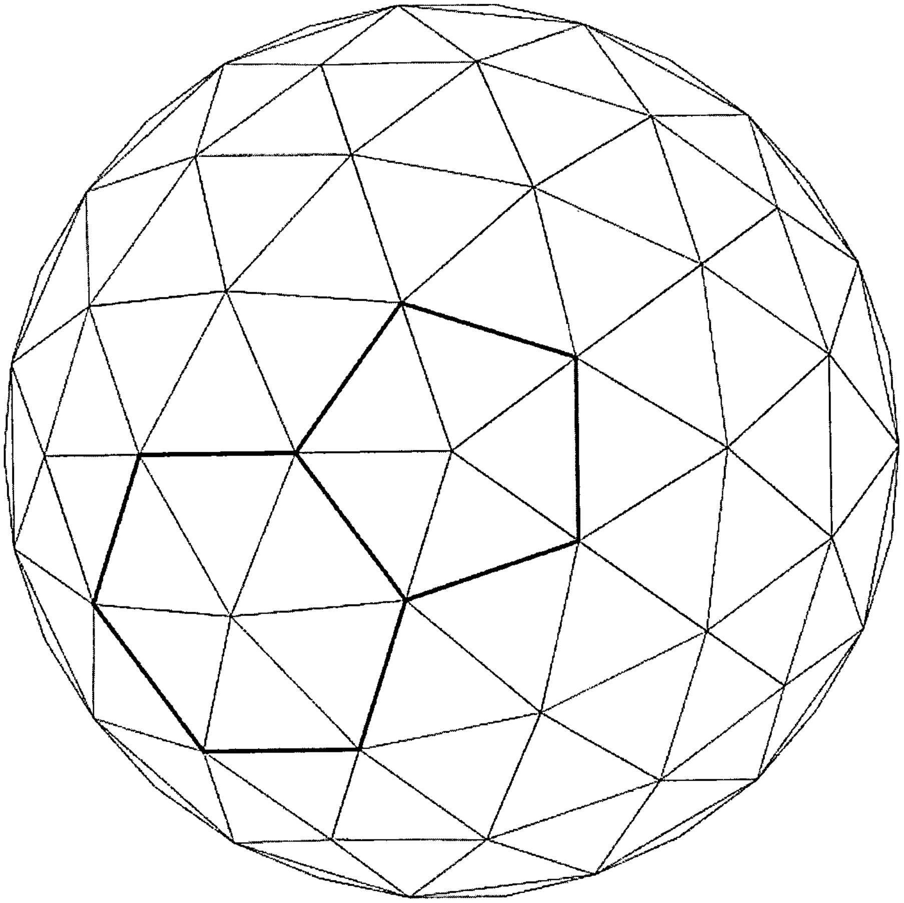
FIG. 1 shows the division of a sphere into triangles, grouped into regular straight pyramids with either a regular pentagon or hexagon as their base.

Various methods of dividing a spherical surface into parts with planar characteristics are known in the art. For example, it is known to divide the surface of a sphere into pentagonal and hexagonal segments that, when combined, form a surface that approximates a sphere, as is the case with a soccer ball. However, in real conditions, the same approach cannot be applied to the construction of a spherical modular video screen, as the materials used to construct a football have the property of deforming under the influence of pressure inside the ball chamber. For rigid constructions of a video screen, the shape of which approximates a spherical surface characterized by a surface of constant positive Gaussian curvature, such an implementation is not possible.

The main advantage is the development and implementation of a partitioning of the video screen surface into specific modules, which allows the construction of a device for displaying a video sequence on a video screen of different sizes with a predetermined step for changing the size of the video screen to meet the corresponding needs, using the video modules described below, but by changing their quantity.

The starting point for further explaining the essence of the invention will be the video modules subPENTA and subHEXA. For convenience, we will denote the first type of video modules as subPENTA video module, and the second type of video modules as subHEXA video module.

A unique aspect of this invention is that the subPENTA and subHEXA video modules can take different forms depending on the level of detail of the construction. Since both subPENTA and subHEXA video modules are designed to approximate a part of the spherical surface describing the spherical modular video screen, they can have a planar implementation. Namely, a certain portion of the imaginary sphere's surface, which ideally represents the video screen, must be adapted for a tangible, material embodiment. The proposed principle for this material embodiment proposes the approximation of a part of the spherical surface by planar video modules.

Of course, the approximation of the imaginary sphere by video modules is performed in a certain order. The claimed invention proposes a method of grouping video modules of the same type to form video modules of the zero level of sphere approximation, namely bigPENTA and bigHEXA. That is, a set of a predetermined number of subPENTA video modules is used to form a spatial structure of a bigPENTA video module, the projection of which on a plane is characterized by a triangular shape, and a set of a predetermined number of subHEXA video modules is used to form a spatial structure of a bigHEXA video module, the projection of which on a plane is characterized by a triangular shape.

It is worth noting that since the bigPENTA and bigHEXA video module projections have a triangular shape, the projection of the subPENTA and subHEXA spatial constructions onto the plane of the corresponding bigPENTA and bigHEXA projections must demonstrate that the boundaries of the subPENTA and subHEXA spatial constructions do not extend beyond the bigPENTA and bigHEXA projections' boundaries. At the same time, the projection of the bigPENTA video module onto the plane is characterized by a triangular shape with two equal lateral sides and a base, and five such projections of five bigPENTA video modules, characterized by a triangular shape, connected to each other by the lateral sides, form the lateral surface of a regular straight pyramid, in the base of which is a regular pentagon, which consists of the five bases of the above five projections of the bigPENTA video modules, and all the vertices of the specified pyramid lie on the surface of the approximated sphere. The same applies to bigHEXA modules: the projection of the bigHEXA video module onto the plane is characterized by a triangular shape with two equal lateral sides and a base, and six such projections of six bigHEXA video modules, characterized by a triangular shape, connected to each other by the lateral sides, form the lateral surface of a regular straight pyramid, the base of which is a regular hexagon, which consists of six bases of the six above projections of bigHEXA video modules, and all the vertices of the indicated pyramid lie on the surface of the approximated sphere.

However, subPENTA and subHEXA video module constructions are spatial, with each subPENTA video module positioned in space so that the vertices of each subPENTA module lie on the surface of an approximated sphere and to approximate the part of the sphere surface that corresponds to the projection of the subPENTA video module onto the surface of the sphere that is approximated.

It should be noted that the subPENTA and subHEXA video modules can be implemented as flat video modules if that realization solves the challenges of approximating the imaginary sphere, or have a spatial embodiment, in the case of dividing the specified subPENTA and subHEXA video modules into modPENTA and modHEXA, respectively.

Figure 4:
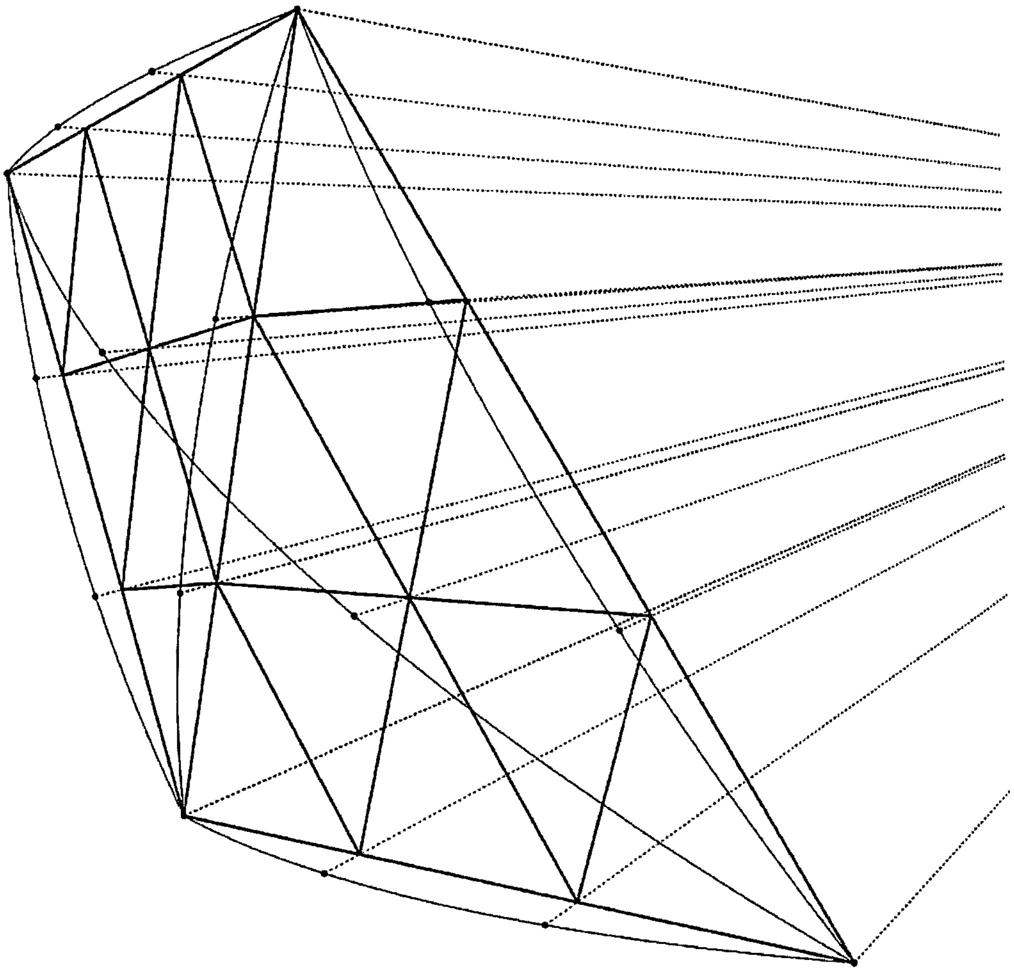
FIG. 4 depicts a triangle representing the bigPENTA video module and a triangle representing the bigHEXA video module, each divided into 9 equal triangles. The points at the vertices of the resulting triangles are projected onto the surface of a sphere by drawing rays from the center of the sphere through these points to intersect with the surface of the sphere.
Figure 5:
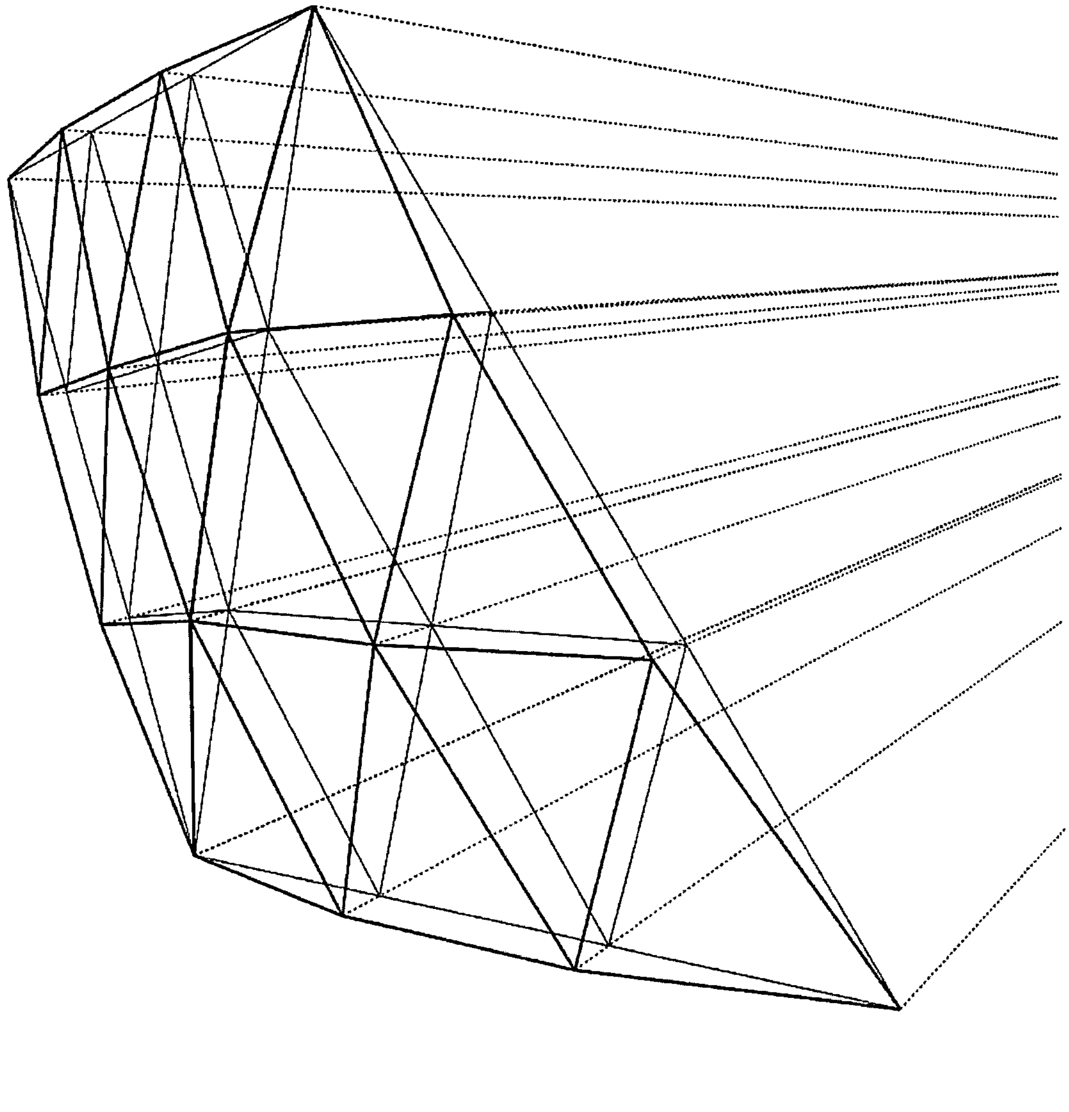
FIG. 5 depicts 9 subPENTA video modules and 9 subHEXA video modules, with the vertices of the triangles representing the subPENTA and subHEXA modules lying on the surface of an approximated sphere. The triangles representing the subPENTA modules are combined to form a three-dimensional shape that represents the bigPENTA video module, while the triangles representing the subHEXA modules are combined to create a three-dimensional shape representing the bigHEXA video module.

In the following, the first-level approximation will be used, which can be understood with reference to FIG. 4, where the bigPENTA video module is divided into 9 triangles within the projection plane of the bigPENTA video module. From this point forward, the term "projection plane" should be understood as the plane that passes through the three extreme points of the spatial structure, which lie at the corners at the vertices of the spatial structure. At the same time, it should be understood that the vertices of the specified video module are placed on the surface of the sphere, which is described around the specified bigPENTA video module. From this point forward, the term "vertex of the video module" should be understood as the point where the edges of the video module form an angle. The 9 triangles formed on the projection are identical. However, when projecting the points at the vertices of the formed triangles onto the sphere's surface by drawing rays that originate from the center of the approximated sphere and pass through the vertices of the 9 formed triangles, which the projection of the bigPENTA video module is divided into, the intersection points of the mentioned rays with the sphere's surface form the vertices of new triangles, as depicted in FIG. 5, and the formed triangles are no longer geometrically identical due to the fact that the surface of the sphere is a surface of constant positive Gaussian curvature, therefore such a projection of figures from the projection plane of the bigPENTA video module onto the surface of the sphere is performed with distortion.

As a result of such division, a bigPENTA video module is obtained, which contains 9 subPENTA video modules. Similarly, this is valid for creating subHEXA video modules, as illustrated in FIG. 4, which shows the division of the bigHEXA video module into 9 triangles within the projection plane of the bigHEXA video module. It is important to note that the vertices of the mentioned video module are located on the surface of a sphere, which is described around the bigHEXA video module. The 9 triangles formed on the projection are identical. However, when projecting the points at the vertices of the formed triangles onto the sphere's surface by drawing rays that originate from the center of the approximated sphere and pass through the vertices of the 9 formed triangles, which the projection of the bigHEXA video module is divided into, the intersection points of the mentioned rays with the sphere's surface form the vertices of new triangles, as depicted in FIG. 5, and the formed triangles are no longer geometrically identical due to the fact that the surface of the sphere is a surface of constant positive Gaussian curvature, therefore such a projection of figures from the projection plane of the bigHEXA video module onto the surface of the sphere is performed with distortion. As a result of such division, a bigHEXA video module is obtained, which contains 9 subHEXA video modules.

Each of these video modules is designed to approximate a portion of the sphere's surface described around the spherical modular video screen. In one variant of the embodiment, each of the subPENTA and subHEXA video modules can be solid, that is, indivisible. In this variant, subPENTA video modules form a set of a predetermined number of subPENTA video modules to create a spatial structure of the bigPENTA video module, the projection of which onto a plane is characterized by a triangular shape. According to this variant of the embodiment, a different number of subPENTA video modules can be used to create the spatial structure of the bigPENTA video module, however, examples of embodiments with a specific number of subPENTA video modules will be given below.

Each subPENTA video module is positioned in space so that the vertices of each subPENTA video module lie on the surface of the approximated sphere, and to approximate the part of the sphere's surface corresponding to the projection of the subPENTA video module onto the approximated sphere's surface. Thus, the approximated sphere is described at least around the subPENTA video modules, and therefore, around the spatial structure of the bigPENTA video module.

Figure 2:
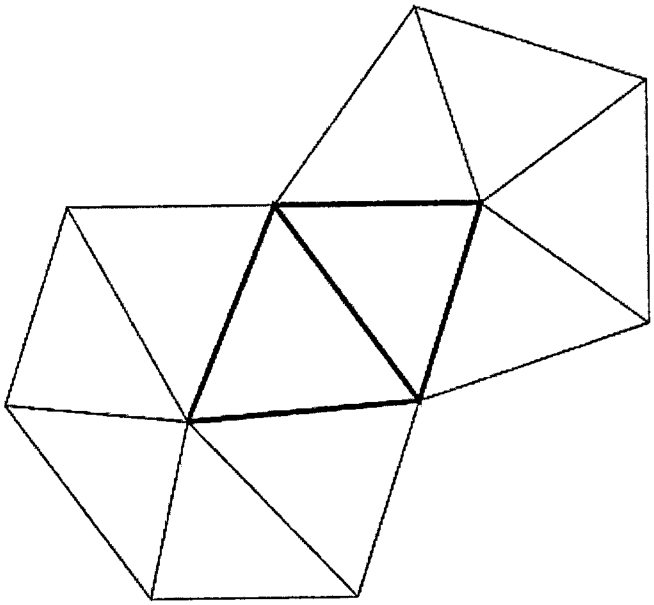
FIG. 2 depicts a regular straight pyramid with a regular hexagon as its base and another regular straight pyramid with a regular pentagon as its base. The lateral surface of the pyramid with a hexagonal base consists of six triangular video modules called bigHEXA, while the lateral surface of the pyramid with a pentagonal base consists of five triangular video modules called bigPENTA. At least one bigPENTA triangular video module and one bigHEXA triangular video module are joined together at their bases.

At the same time, the projection of the bigPENTA video module onto a plane is characterized by a triangular shape with two equal sides and a base. It should be understood that the bigPENTA video module is a spatial figure formed by a set of subPENTA video modules connected to each other. For simplicity, the description of the bigPENTA video module's structure is given through projection onto a plane. However, this does not impose a restriction on the execution of the bigPENTA video module as planar. The projections of five bigPENTA video modules, characterized by a triangular shape, connected to each other by side faces, form, as shown in FIGS. 1-2, the lateral surface of a regular right pyramid with a regular pentagon base, the sides of which are the bases of the above-mentioned projections of bigPENTA video modules, and all vertices of the mentioned pyramid lie on the surface of the approximated sphere.

The subHEXA video modules form a set of a predetermined number of subHEXA video modules to create a spatial structure of the bigHEXA video module, the projection of which onto a plane is characterized by a triangular shape. According to this variant of the embodiment, a different number of subHEXA video modules can be used to create the spatial structure of the subHEXA video module, however, examples of embodiments with a specific number of subHEXA video modules will be given below.

Each subHEXA video module is positioned in space so that the vertices of each subHEXA video module lie on the surface of the approximated sphere, and to approximate the part of the sphere's surface corresponding to the projection of the subHEXA video module onto the approximated sphere's surface. Thus, the approximated sphere is described at least around the subHEXA video modules, and therefore, around the spatial structure of the bigHEXA video module.

At the same time, the projection of the bigHEXA video module onto a plane is characterized by a triangular shape with two equal sides and a base. It should be understood that the bigHEXA video module is a spatial figure formed by a set of subHEXA video modules connected to each other. For simplicity, the description of the bigHEXA video module's structure is given through projection onto a plane. However, this does not impose a restriction on the execution of the bigHEXA video module as planar. The projections of five bigHEXA video modules, characterized by a triangular shape, connected to each other by side faces, form, as shown in FIGS. 1-2, the lateral surface of a regular right pyramid with a regular pentagon base, the sides of which are the bases of the above-mentioned projections of bigHEXA video modules, and all vertices of the mentioned pyramid lie on the surface of the approximated sphere.

Figure 3:
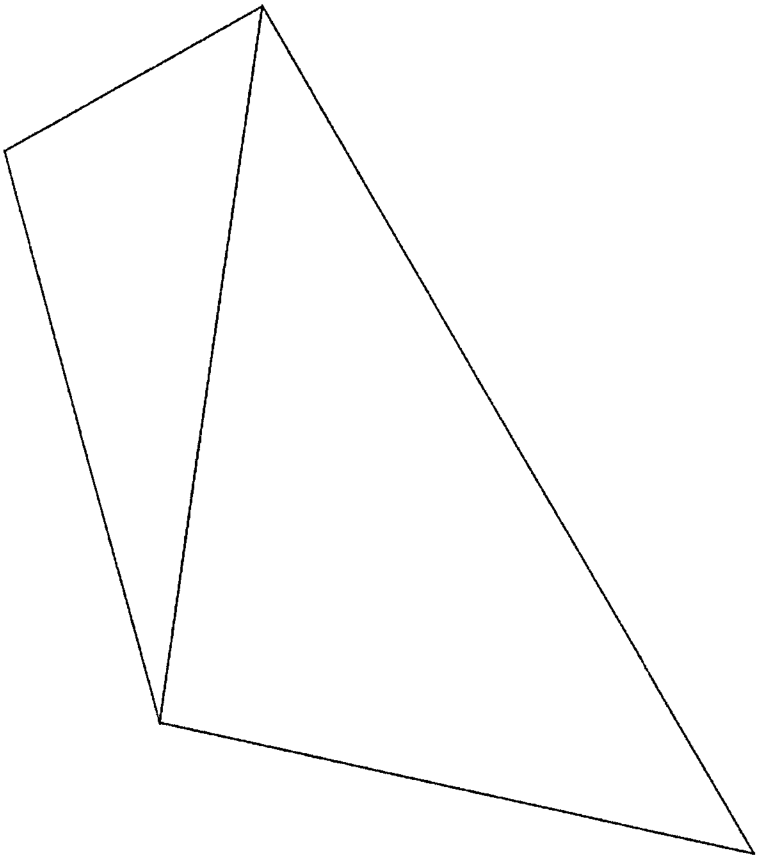
FIG. 3 illustrates the bigPENTA triangular video module and the bigHEXA triangular video module, which are joined together at their bases.

As shown in FIG. 1-3, at least one bigHEXA video module and at least one bigPENTA video module are aligned with each other by their bases.

Figure 8:
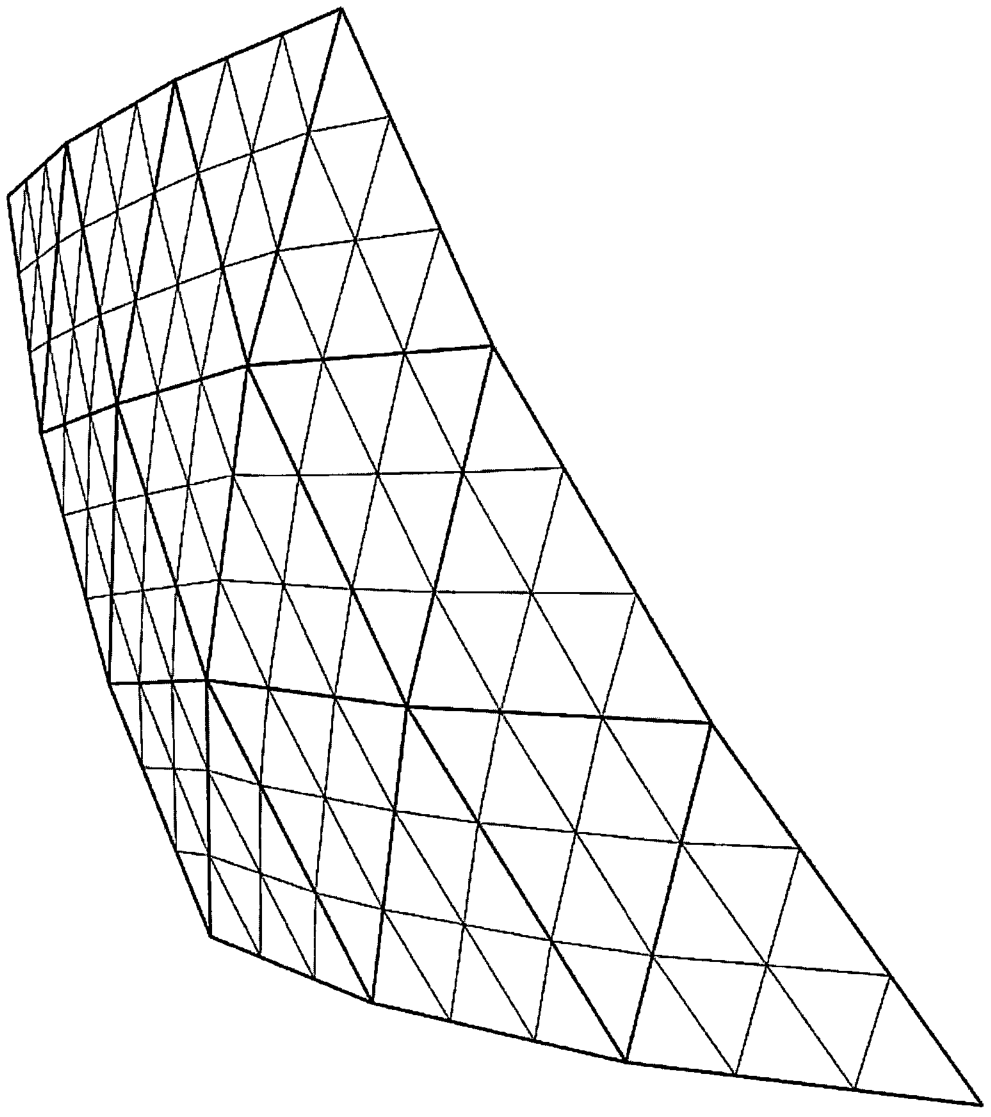
FIG. 8 depicts 9 subPENTA and 9 subHEXA video modules are shown, with the vertices of the triangles representing the subPENTA and subHEXA modules lying on the surface of an approximated sphere. The triangles that represent the subPENTA video modules are combined to form a three-dimensional shape that represents the bigPENTA video module, while the triangles that represent the subHEXA video modules are combined to form a three-dimensional shape representing the bigHEXA video module. Additionally, each subPENTA video module is further divided into 9 triangles, forming 9 modPENTA video modules, and each subHEXA video module is further divided into 9 triangles, forming 9 modHEXA video modules.
Figure 9:
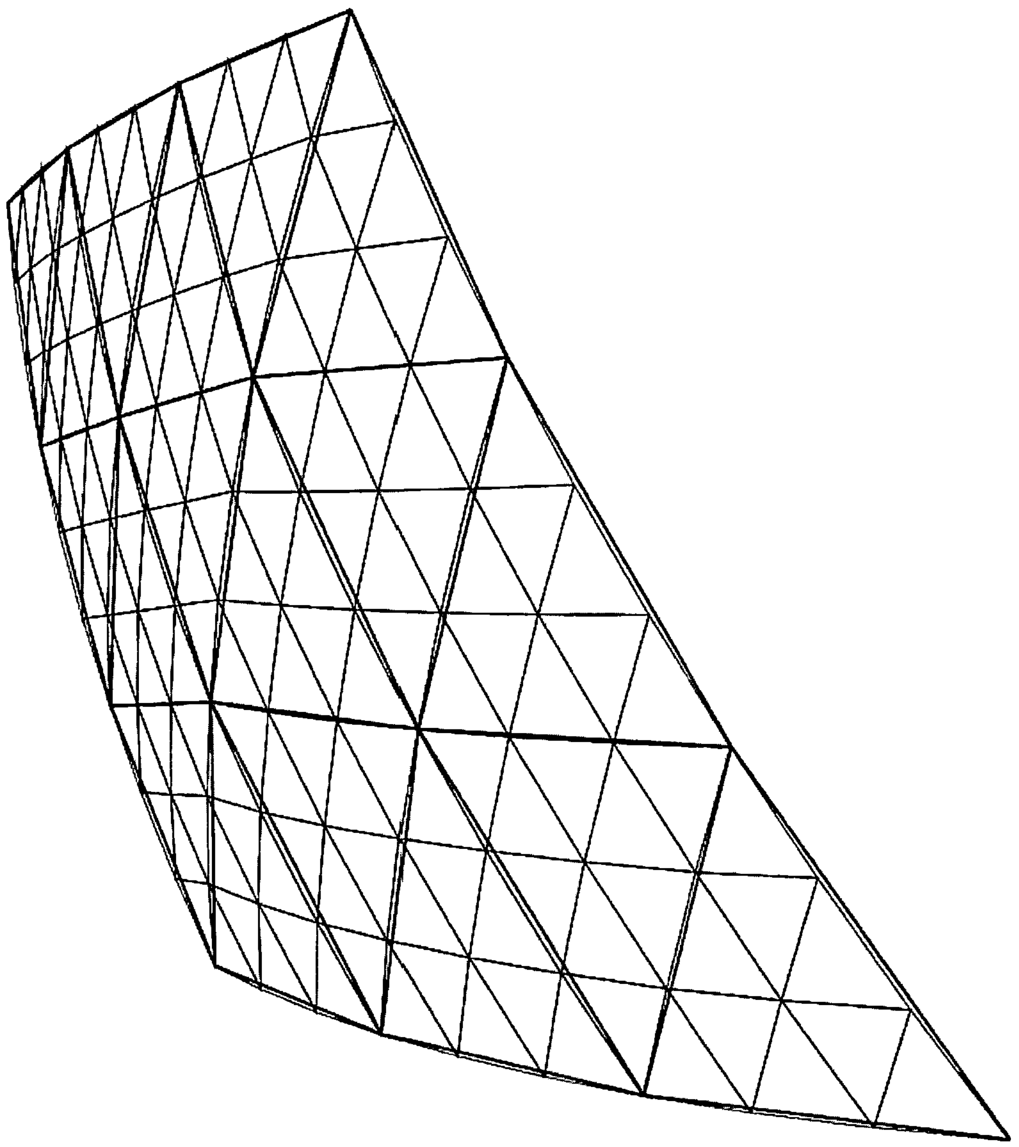
FIG. 9 depicts 9 subPENTA and 9 subHEXA video modules, with the vertices of the three-dimensional shapes representing the subPENTA and subHEXA modules lying on the surface of an approximated sphere. The three-dimensional shapes that represent subPENTA modules are combined to form a shape representing the bigPENTA video module, while the three-dimensional shapes that represent the subHEXA modules are combined to form a shape representing the bigHEXA video module. Additionally, each subPENTA video module is further divided into 9 modPENTA video modules, represented by triangles with vertices lying on the surface of an approximated sphere, and each subHEXA video module is further divided into 9 modHEXA video modules, represented by triangles with vertices lying on the surface of an approximated sphere.

In the following, the concept of "second-type approximation" will be used. This concept is illustrated in FIG. 8, which shows an example of dividing a bigPENTA video module into 9 subPENTA video modules. Each subPENTA video module, within the plane of its projection, is divided into 9 equal-sized modPENTA video modules. Then, from the projection plane of the corresponding subPENTA video module, 9 modPENTA video modules are transferred to the positioning of their vertices on the surface of a triangular segment of the sphere, corresponding to the projection of the respective subPENTA video module onto the surface of the approximated sphere. Thus, the positioning of these modPENTA video modules on the surface of the approximated sphere is performed. FIG. 9 depicts how the vertices of the modPENTA video modules are placed on the surface of the approximated sphere.

Figure 10:
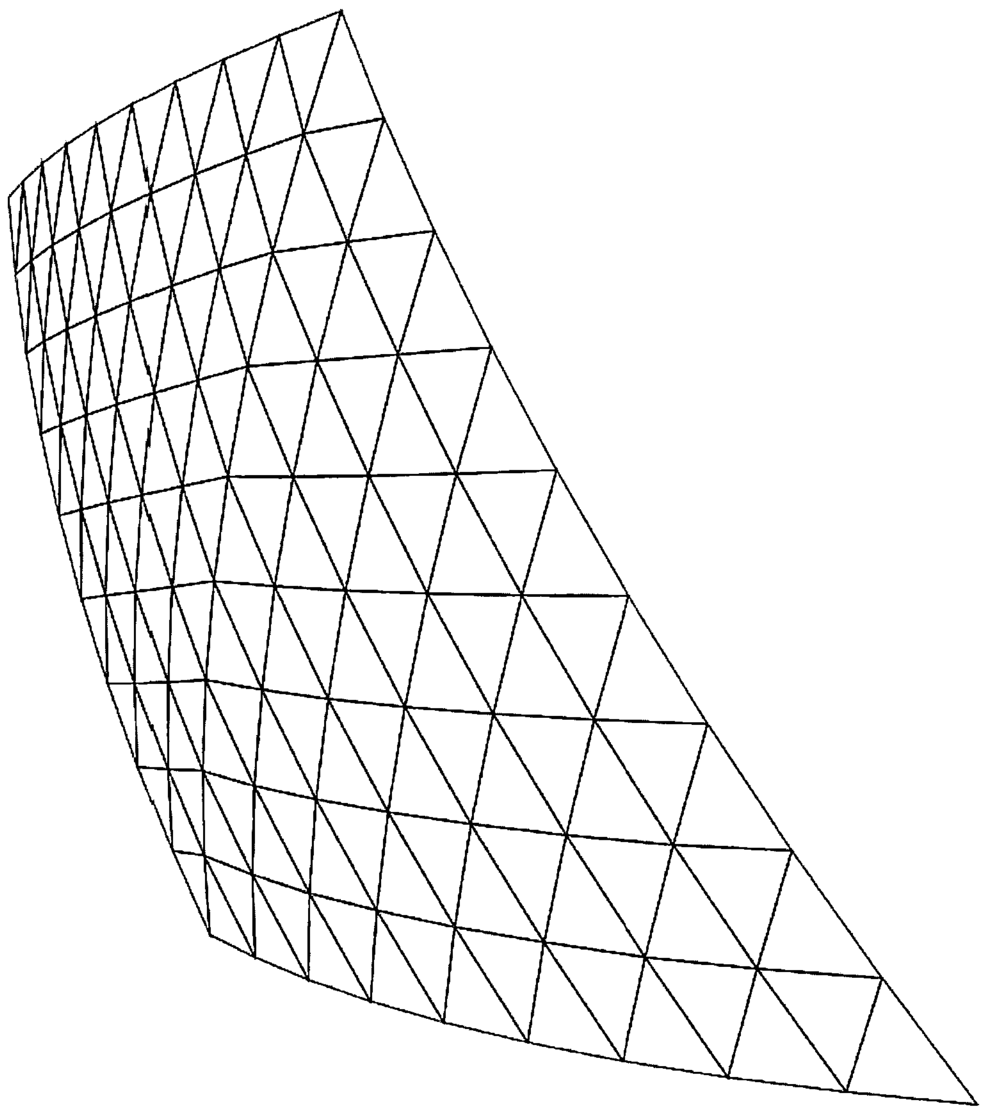
FIG. 10 illustrates modPENTA and modHEXA video modules, where 9 corresponding modPENTA modules are combined to form a subPENTA module, and 9 subPENTA modules are combined to form a bigPENTA module. Similarly, 9 modHEXA modules are combined to form a subHEXA module, and 9 subHEXA modules are combined to form a bigHEXA module.

As a result of such division, a bigPENTA video module is obtained, which contains 9 subPENTA video modules, where each subPENTA video module is divided into 9 modPENTA video modules, as shown in FIG. 10.

A similar process applies to the creation of modHEXA video modules, as illustrated in FIG. 8, which shows an example of dividing a bigHEXA video module into 9 subHEXA video modules. Each subHEXA video module, within the plane of its projection, is divided into 9 equal-sized modHEXA video modules. Then, from the projection plane of the corresponding subHEXA video module, 9 modHEXA video modules are transferred to the positioning of their vertices on the surface of a triangular segment of the sphere, corresponding to the projection of the respective subHEXA video module onto the surface of the approximated sphere. Thus, the positioning of these modHEXA video modules on the surface of the approximated sphere is performed. FIG. 9 depicts how the vertices of the modHEXA video modules are placed on the surface of the approximated sphere.

As a result of this division, a bigHEXA video module is obtained, which contains 9 subHEXA video modules, where each subHEXA video module is divided into 9 modHEXA video modules, as shown in FIG. 10.

In the first improvement of the claimed technical solution, each subPENTA video module contains a set of identical modPENTA video modules, each of which is characterized by a triangular shape. The modPENTA video module is the smallest constituent element for the spatial structure of the bigPENTA video module. From the above, it becomes clear that the subPENTA video module can have a planar shape, but in the case of dividing it into modPENTA video modules, the subPENTA video module can be implemented as a spatial structure. In the latter case, the vertices of the modPENTA video modules lie on the surface of the approximated sphere, forming the spatial structure of the subPENTA video module.

In other words, the modPENTA video modules are mutually arranged in space to approximate a portion of the sphere's surface corresponding to the projection of the subPENTA video module onto the surface of the approximated sphere. At the same time, the vertices of the subPENTA video module projected onto the plane coincide with the vertices of the modPENTA video modules, which are placed in the corresponding corners of the subPENTA video module's spatial structure.

Each subHEXA video module contains a set of identical modHEXA video modules, each of which is characterized by a triangular shape. The modHEXA video module is the smallest constituent element for the spatial structure of the bigHEXA video module. From the above, it becomes clear that the subHEXA video module can have a planar shape, but in the case of dividing it into modHEXA video modules, the subHEXA video module can be implemented as a spatial structure. In the latter case, the vertices of the modHEXA video modules lie on the surface of the approximated sphere, forming the spatial structure of the subHEXA video module.

In other words, the modHEXA video modules are mutually arranged in space to approximate a portion of the sphere's surface corresponding to the projection of the subHEXA video module onto the surface of the approximated sphere. At the same time, the vertices of the subHEXA video module projected onto the plane coincide with the vertices of the modHEXA video modules, which are placed in the corresponding corners of the subHEXA video module's spatial structure.

According to the second improvement of the claimed technical solution, the bigPENTA video module contains at least 4 subPENTA video modules, each projecting a triangular shape onto a plane. At the same time, the projection of the bigPENTA video module, which consists of 4 subPENTA video modules, on the plane will also be characterized by a triangular shape.

To explain the combination of subPENTA video modules into a bigPENTA video module, the notation of the sides of the subPENTA video module, which is indivisible according to this version of the embodiment, will be used below. It should be noted that explaining the invention through the geometry of its components provides simplicity, conciseness, and clarity of presentation of the essence. With reference to the above, each subPENTA video module has first, second, and third sides connected to one another. Naturally, there is a certain plane between these sides, which serves as the base for placing at least one element for video image reproduction. When combining the mentioned subPENTA video modules, the resulting spatial structure is characterized by a projection onto a plane. The specified projection coincides with the bigPENTA video module's projection onto the same plane. The vertices of the mentioned triangular projections, when aligned, will coincide and lie on the surface of the approximated sphere.

In this embodiment, the bigHEXA video module contains at least 4 subHEXA video modules, each projecting a triangular shape onto a plane. At the same time, the projection of the bigHEXA video module, which consists of 4 subHEXA video modules, on the plane will also be characterized by a triangular shape.

To explain the combination of subHEXA video modules into a bigHEXA video module, the notation of the sides of the subHEXA video module, which is indivisible according to this version of the embodiment, will be used below. It should be noted that explaining the invention through the geometry of its components provides simplicity, conciseness, and clarity of presentation of the essence. With reference to the above, each subHEXA video module has first, second, and third sides connected to one another. Naturally, there is a certain plane between these sides, which serves as the base for placing at least one element for video image reproduction. When combining the mentioned subHEXA video modules, the resulting spatial structure is characterized by a projection onto a plane. The specified projection coincides with the bigHEXA video module's projection onto the same plane. The vertices of the mentioned triangular projections, when aligned, will coincide and lie on the surface of the approximated sphere.

According to the present invention, six bigHEXA video modules are designed with the possibility of combining with each other in such a way that six of their corresponding remote vertices align at a single point. This point forms the apex of a pyramid with a hexagonal base. Each of the other two remote vertices of each bigHEXA video module is aligned with the remote vertex of an adjacent bigHEXA video module. That is, these points characterize the vertices of the pyramid's base angles. At the same time, each vertex of each bigHEXA video module lies on the surface of the approximated sphere.

Five bigPENTA video modules are designed with the possibility of combining with each other in such a way that five of their corresponding remote vertices align at a single point. This point forms the apex of a pyramid with a pentagonal base. Each of the other two remote vertices of each bigPENTA video module is aligned with the remote vertex of an adjacent bigPENTA video module. That is, these points characterize the vertices of the pyramid's base angles. At the same time, each vertex of each bigPENTA video module lies on the surface of the approximated sphere.

Since a spherical modular video screen can approximate the entire sphere or only a part of it, in order to understand the essence of the claimed invention, the minimum number of bigHEXA and bigPENTA video modules is determined to solve the given problem. The applicant has determined that this minimum number is at least one bigHEXA video module and at least one bigPENTA video module adjacently connected on the frame.

Further, according to the first embodiment, it is provided that the bigPENTA video module contains at least 9 subPENTA video modules, and the projection of each of which on the plane is characterized by a triangular shape. The applicant discovered that when using 9 subPENTA video modules of the same size, excessive gaps appear in the structure of the formed bigPENTA video module. Additionally, these mentioned at least 9 subPENTA video modules are interconnected to form a bigPENTA video module, which is characterized by a triangular shape. At the same time, the part of the sphere approximated by the formed bigPENTA video module is determined by its three remote vertices, which lie on the surface of this sphere, and which coincide with the three remote vertices of the connected to each other subPENTA video modules.

The aforementioned embodiments have drawbacks: the integrity of the displayed video image is significantly reduced due to distortions, resulting in a segmented video image for the viewer. Additionally, using identical subPENTA modules reduces the degree of approximation of the sphere described around the device for displaying a video sequence. Therefore, the following division is applied in this invention, according to which the specified 9 subPENTA video modules are characterized as subPENTA video modules of the 1st type, the first and second of the 2nd type, the first, second and third of the 3rd type, the first and second of the 4th type and 5th type. Each subPENTA module has first, second, and third sides connected to each other. Moreover, when connecting these specified subPENTA modules, the resulting structure is characterized by a projection onto a plane, which coincides with the projection of the bigPENTA module onto the same plane, characterized by first, second, and third sides. Furthermore, the subPENTA modules are divided into five types, and each type is characterized by the same dimensions within the type.

Additionally, it should be noted that the described subPENTA video module can have either a flat or a spatial configuration. In the case of a flat configuration, the subPENTA video module has a triangular shape. However, in either case, the projections onto a plane for both the flat and spatial configurations will have the same appearance.

In Table 1 below, the arrangement of the 9 subPENTA video modules relative to each other within the bigPENTA video module is shown. For better understanding, the coincidence of the sides is provided in the projection on the plane.

9 subHEXA video modules of the same size, excessive gaps appear in the structure of the formed bigHEXA video module.

Additionally, these mentioned at least 9 subHEXA video modules are interconnected to form the bigHEXA video module, which is characterized by a triangular shape. At the same time, the part of the sphere approximated by the formed bigHEXA video module is determined by its three remote vertices, which lie on the surface of this sphere, and which coincide with the three remote vertices of the connected to each other subHEXA video modules.

This significantly reduces the integrity of the displayed video image due to distortions, resulting in a segmented video image for the viewer. Additionally, using identical subHEXA modules reduces the degree of approximation of

TABLE 1

| | First side | Second side | Third side |
|---|---|---|---|
| subPENTA video module of the 1st type | First side of the bigPENTA video module* | First side of the second subPENTA video module of the 2nd type | Third side of the bigPENTA video module* |
| First subPENTA video module of the 2nd type | Second side of the second subPENTA video module of the 3rd type | Second side of the bigPENTA video module* | Third side of the second subPENTA video module of the 4th type |
| Second subPENTA video module of the 2nd type | Second side of the subPENTA video module of the 1st type | First side of the third subPENTA video module of the 3rd type | Third side of the first subPENTA video module of the 4th type |
| First subPENTA video module of the 3rd type | First side of the bigPENTA video module* | Second side of the bigPENTA video module* | Third side of the second subPENTA video module of the 3rd type |
| Second subPENTA video module of the 3rd type | Second side of the first subPENTA video module of the 4th type | First side of the first subPENTA video module of the 2nd type | Third side of the first subPENTA video module of the 3rd type |
| Third subPENTA video module of the 3rd type | Second side of the second subPENTA video module of the 2nd type | First side of the second subPENTA video module of the 4th type | Third side of the bigPENTA video module* |
| First subPENTA video module of the 4th type | First side of the bigPENTA video module* | First side of the second subPENTA video module of the 3rd type | Third side of the second subPENTA video module of the 2nd type |
| Second subPENTA video module of the 4th type | Second side of the third subPENTA video module of the 3rd type | First side of the subPENTA video module of the 5th type | Third side of the first subPENTA video module of the 2nd type |
| subPENTA video module of the 5th type | Second side of the second subPENTA video module of the 4th type | Second side of the bigPENTA video module* | Third side of the bigPENTA video module* |

*partial coincidence

In the above table, the first column lists the five types of subPENTA video modules. In the rows of the second, third, and fourth columns, which correspond to the first, second, and third sides of the respective subPENTA video module, it is shown which side of which subPENTA video module of which type it is adjacent to.

Partial coincidence means that a certain side of a certain subPENTA video module of a certain type, in projection onto the plane of the bigPENTA video module, corresponds to the respective side of the bigPENTA video module at an approximate ratio of 1:3.

Also, this embodiment provides that the bigHEXA video module contains at least 9 subHEXA video modules, the projection of each of which on the plane is characterized by a triangular shape. The applicant discovered that when using the sphere described around the device for displaying a video sequence. Therefore, the following division is applied in this invention, according to which the specified 9 subHEXA video modules are characterized as subHEXA video modules of the 1st type, the first and second of the 2nd type, the first, second and third of the 3rd type, the first and second of the 4th type and 5th type. Each subHEXA module has first, second, and third sides connected to each other. Moreover, when connecting these specified subHEXA modules, the resulting structure is characterized by a projection onto a plane, which coincides with the projection of the bigHEXA module onto the same plane, characterized by first, second, and third sides. Furthermore, the subHEXA modules are divided into five types, and each type is characterized by the same dimensions within the type.

Additionally, it should be noted that the described subHEXA video module can have either a flat or a spatial configuration. In the case of a flat configuration, the subHEXA video module has a triangular shape. However, in either case, the projections onto a plane for both the flat and spatial configurations will have the same appearance.

In Table 2 below, the arrangement of the 9 subHEXA video modules relative to each other within the bigHEXA video module is shown. For better understanding, the coincidence of the sides is provided in the projection on the plane.

TABLE 2

| | First side | Second side | Third side |
|---|---|---|---|
| subHEXA video module of the 1st type | First side of the bigHEXA video module* | First side of the second subHEXA video module of the 2nd type | Third side of the bigHEXA video module* |
| First subHEXA video module of the 2nd type | Second side of the second subHEXA video module of the 3rd type | Second side of the bigHEXA video module* | Third side of the second subHEXA video module of the 4th type |
| Second subHEXA video module of the 2nd type | Second side of the subHEXA video module of the 1st type | First side of the third subHEXA video module of the 3rd type | Third side of the first subHEXA video module of the 4th type |
| First subHEXA video module of the 3rd type | First side of the bigHEXA video module* | Second side of the bigHEXA video module* | Third side of the second subHEXA video module of the 3rd type |
| Second subHEXA video module of the 3rd type | Second side of the first subHEXA video module of the 4th type | First side of the first subHEXA video module of the 2nd type | Third side of the first subHEXA video module of the 3rd type |
| Third subHEXA video module of the 3rd type | Second side of the second subHEXA video module of the 2nd type | First side of the second subHEXA video module of the 4th type | Third side of the bigHEXA video module* |
| First subHEXA video module of the 4th type | First side of the bigHEXA video module* | First side of the second subHEXA video module of the 3rd type | Third side of the second subHEXA video module of the 2nd type |
| Second subHEXA video module of the 4th type | Second side of the third subHEXA video module of the 3rd type | First side of the subHEXA video module of the 5th type | Third side of the first subHEXA video module of the 2nd type |
| subHEXA video module of the 5th type | Second side of the second subHEXA video module of the 4th type | Second side of the bigHEXA video module* | Third side of the bigHEXA video module* |

*partial coincidence

In the above table, the first column lists the five types of subHEXA video modules. In the rows of the second, third, and fourth columns, which correspond to the first, second, and third sides of the respective subHEXA video module, it is shown which side of which subHEXA video module of which type it is adjacent to.

Partial coincidence means that a certain side of a certain subHEXA video module of a certain type, in projection onto the plane of the bigHEXA video module, corresponds to the respective side of the bigHEXA video module at an approximate ratio of 1:3.

According to this variant of the embodiment, which provides for the implementation of the subPENTA video module with as a spatial construction, the division of the subPENTA video modules of the 1-5th type into the corresponding modPENTA video modules of the 1-5th type is determined.

According to it, the subPENTA video module of the 1st type contains at least 4 modPENTA video modules of the 1st type of the same size, the subPENTA video module of the 2nd type contains at least 4 modPENTA video modules of the 2nd type of the same size, the subPENTA video module of the 3rd type contains at least 4 modPENTA video modules of the 3rd type of the same size, the subPENTA video module of the 4th type contains at least 4 modPENTA video modules of the 4th type of the same size, the subPENTA video module of the 5th type contains at least 4 modPENTA video modules of the 5th type of the same size.

Figure 6:
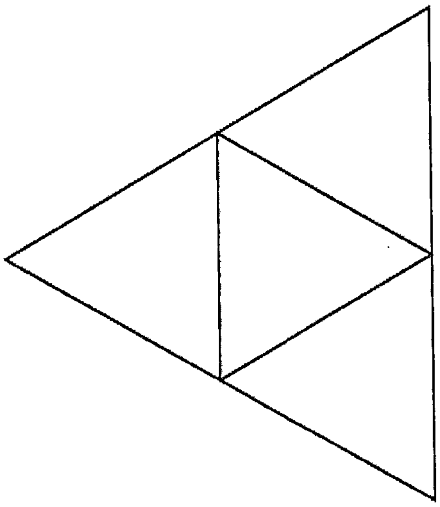
FIG. 6 illustrates a variant of the video module divided into 4 components.

The combination of modPENTA video modules of any type is performed as shown in FIG. 6, namely with the formation of such a subPENTA video module, the projection of which on the plane has a triangular shape.

Figure 7:
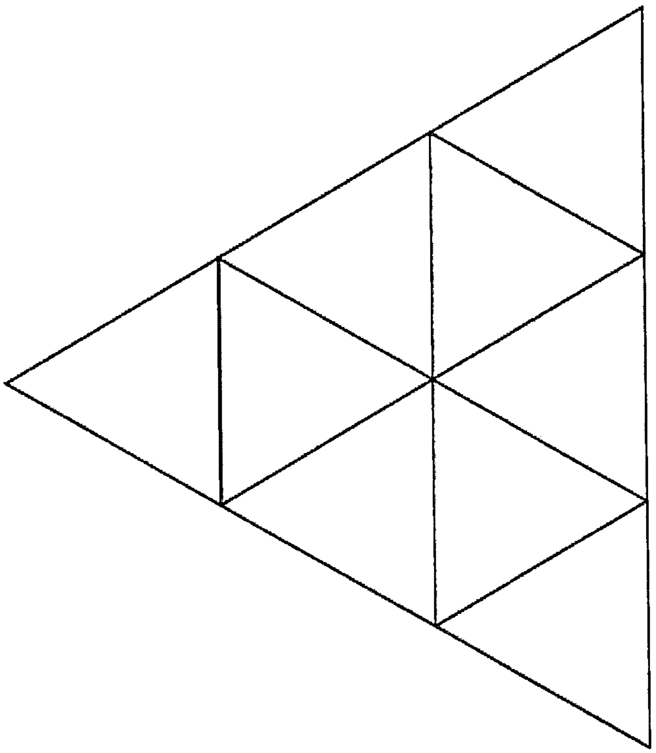
FIG. 7 illustrates a variant of the video module divided into 9 components.

The principle of increasing the diameter of the device for displaying a video sequence is explained with the help of FIGS. 6 and 7. In FIG. 6, a subPENTA video module is shown, formed by combining 4 modPENTA video modules. To increase the diameter of the device for displaying a video sequence, modPENTA modules are added to each subPENTA video module and combined in such a way as to maintain the proportions of the subPENTA video module's sides. In FIG. 7, it can be seen that five modPENTA video modules have been added to the subPENTA video module compared to FIG. 6. As a result of the combination, a subPENTA video module structure containing 9 modPENTA video modules is formed.

A similar principle of increasing the diameter of the device for displaying a video sequence applies to the further addition to a subPENTA video module containing 9 modPENTA video modules of seven or of another number of modPENTA video modules, according to the mathematical expression (1).

Similarly, the subHEXA video module of the 1st type contains at least 4 modHEXA video modules of the 1st type of the same size, the subHEXA video module of the 2nd type contains at least 4 modHEXA video modules of the 2nd type of the same size, the subHEXA video module of the 3rd type contains at least 4 modHEXA video modules of the 3rd type of the same size, the subHEXA video module of the 4th type contains at least 4 modHEXA video modules of the 4th type of the same size, the subHEXA video module of the 5th type contains at least 4 modHEXA video modules of the 5th type of the same size.

The combination of modHEXA video modules of any type is performed as shown in FIG. 6, namely with the formation of such a subHEXA video module, the projection of which on the plane has a triangular shape.

The principle of increasing the diameter of the device for displaying a video sequence is explained with the help of FIGS. 6 and 7. In FIG. 6, a subHEXA video module is shown, formed by combining 4 modHEXA video modules. To increase the diameter of the device for displaying a video sequence, modHEXA modules are added to each subHEXA video module and combined in such a way as to maintain the proportions of the subHEXA video module's sides. In FIG. 7, it can be seen that five modHEXA video modules have been added to the subHEXA video module compared to FIG. 6. As a result of the combination, a subHEXA video module structure containing 9 modHEXA video modules is formed.

A similar principle of increasing the diameter of the device for displaying a video sequence applies to the further addition to a subHEXA video module containing 9 modHEXA video modules of seven or of another number of modHEXA video modules, according to the mathematical expression (1).

As noted above, the claimed spherical modular video screen can be designed with an increasing radius. The screen's radius is increased by simultaneously adding identically sized modPENTA video modules to the subPENTA video module and adding identically sized modHEXA video modules to the subHEXA video module. That is, only 10 unique elements are used to construct a spherical modular video screen of any size with a specific step.

The increase in size is achieved by simultaneous addition:

to the subPENTA video module of the 1st type of modPENTA video modules of the 1st type of the same size, to the subPENTA video module of the 2nd type of modPENTA video modules of the 2nd type of the same size, to the subPENTA video module of the 3rd type of modPENTA video modules of the 3rd type of the same size, to the subPENTA video module of the 4th type of modPENTA video modules of the 4th type of the same size, to the subPENTA video module of the 5th type of modPENTA video modules of the 5th type of the same size, to the subHEXA video module of the 1st type of modHEXA video modules of the 1st type of the same size, to the subHEXA video module of the 2nd type of modHEXA video modules of the 2nd type of the same size, to the subHEXA video module of the 3rd type of modHEXA video modules of the 3rd type of the same size, to the subHEXA video module of the 4th type of modHEXA video modules of the 4th type of the same size, to the subHEXA video module of the 5th type of modHEXA video modules of the 5th type of the same size.

The increase in the size of the spherical modular video screen has a certain regularity, which is expressed by the following formula:

$$Snext = (N+1)^2 - N^2, \quad (1)$$

where N is an integer representing the degree of subdivision for subPENTA or subHEXA video modules, where $N=\sqrt{Scur}$ (2).

Since a subPENTA video module consists only of identical modPENTA video modules of the corresponding type, and a subHEXA video module consists only of identical modHEXA video modules of the corresponding type, then Scur represents the number of modPENTA video modules in any subPENTA video module, or the number of modHEXA video modules in any subHEXA video module for the corresponding degree of subdivision.

Snext is the number of modPENTA or modHEXA modules that are required to be added to each corresponding subPENTA or subHEXA video module of a video screen with the degree of subdivision N, in order to obtain the next size of a spherical modular video screen, corresponding to the next degree of subdivision N.

At the same time, it should be taken into account that the enlarged subPENTA or subHEXA video module can be characterized as rows of modPENTA or modHEXA video modules, where the first row is one modPENTA or modHEXA video module, the second row is three modPENTA or modHEXA video modules, the third row is five modPENTA or modHEXA video modules, etc., where the increase in the number of modPENTA or modHEXA video modules in the next row can be determined by using the above mathematical expression. That is, the surface formed by triangles approaches in terms of its characteristics to a spherical surface or its part (segment). Thus, with an increase in the degree of detailing, the formed shape becomes more similar to a spherical one.

This explains the relationship between the degree of subdivision (partition) of a specific subPENTA or subHEXA video module and the number of modPENTA or modHEXA modules characterizing a certain degree of subdivision. That is, to increase the size of the spherical modular video screen, it is necessary to know its current degree of subdivision. Using the provided mathematical expression, it is possible to calculate the number of modPENTA or modHEXA video modules that must be added to each corresponding subPENTA or subHEXA video module. At the same time, the dimensions of the spherical modular video screen for each degree of subdivision can be determined in advance, if the actual dimensions of the modPENTA or modHEXA video modules are known.

Figure 11:
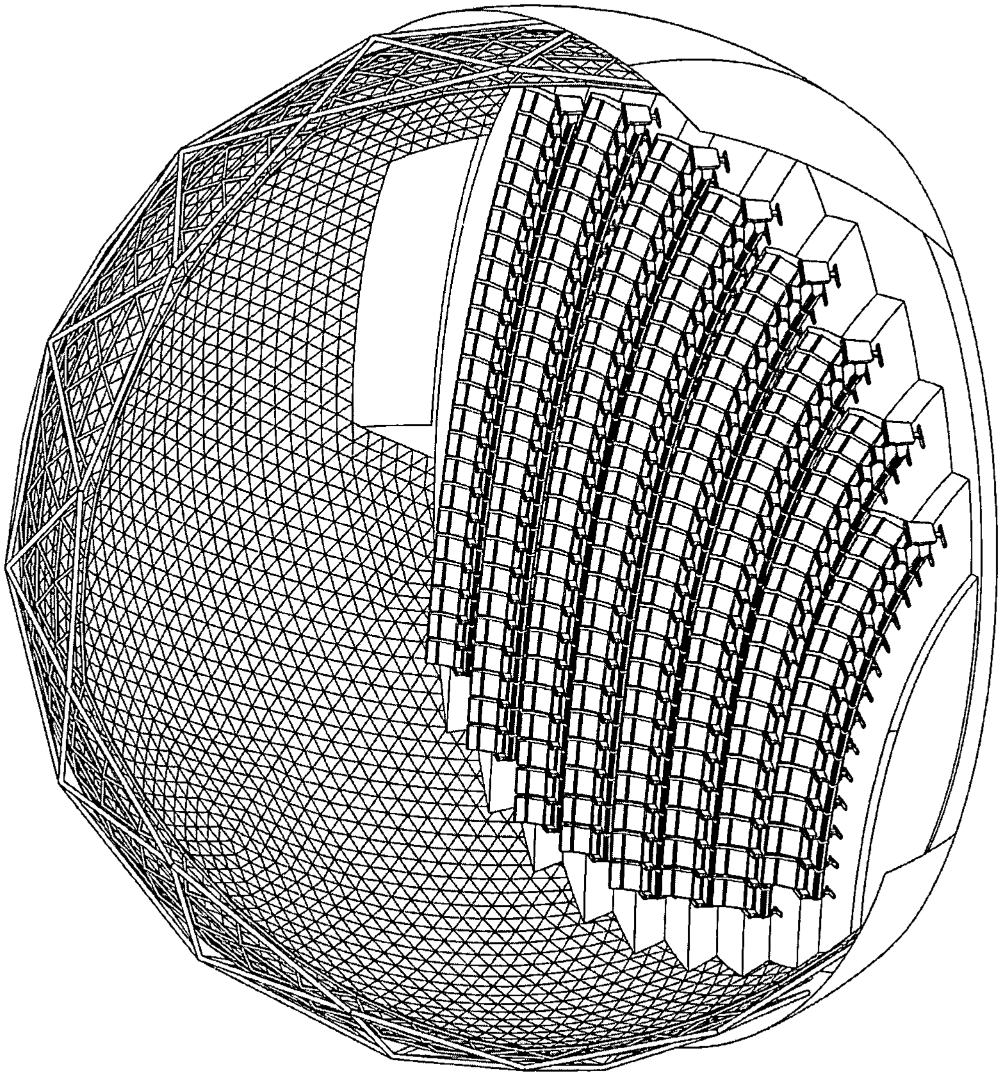
FIG. 11 illustrates a cross-sectional view of a spherical modular video screen as part of an LED planetarium project.

FIG. 11 illustrates a device for displaying a visual sequence, comprising a frame on which a plurality of bigHEXA video modules and a plurality of bigPENTA video modules are mounted, forming a spherical modular video screen. In particular, the device for displaying a visual sequence may include in its design a spherical modular video screen, which has at least one bigHEXA video module and at least one bigPENTA video module. The number of video modules depends on the area and percentage of the surface of the sphere, which is approximated by the specified video modules.

In the variant shown in FIG. 11, provision is made for the location on the inner surface of the device for displaying a visual sequence of a plurality of elements of displaying a visual sequence on the surface of at least one bigHEXA video module and at least one bigPENTA video module of a spherical modular screen.

Figure 12:
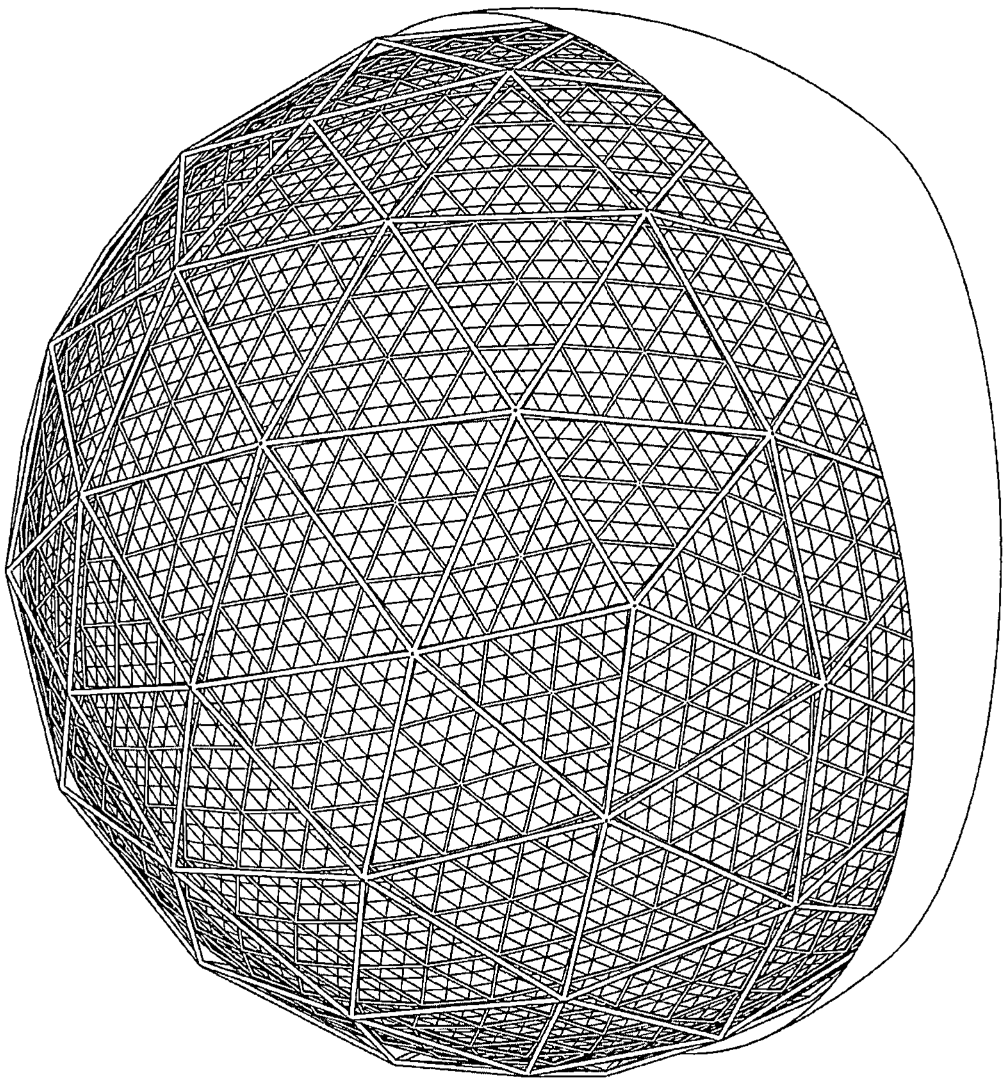
FIG. 12 illustrates the exterior view of the spherical modular video screen.

FIG. 12 depicts that on the frame, a portion of the spherical surface approximated by five bigPENTA video modules is adjacent to five spherical surface portions, each of which is approximated by six bigHEXA video modules. At the same time, it should be understood that the frame can be implemented in the middle of the sphere to form a device for displaying a visual sequence with an outer surface that reproduces the visual sequence.

Additionally, it should be noted that the frame is made of metal ribs that are detachably interconnected. This allows the claimed device for displaying a visual sequence of a predetermined size to be mounted and utilized as well as disassembled, if necessary.

The invention may have developments and refinements that directly or indirectly arise from the above description. However, the information provided in the description is sufficient for a specialist in the field to understand the essence of the claimed invention, the method of solving the problem, and the way to achieve technical advantages.

The above description should provide a specialist in this field of technology with all the necessary information for the implementation of the claimed invention according to any of its possible variants of embodiment, as set forth in the appended claims.

The invention claimed is:

1. A spherical modular video screen comprising a plurality of video modules connected on a frame, where the plurality of said video modules includes a first type of video modules and a second type of video modules, wherein:

the first type of video modules is a subPENTA video module, and the second type of video modules is a subHEXA video module, where each of the video modules is designed to approximate a part of a surface of a sphere described around a spherical modular video screen, and the subPENTA video modules form a set of a predetermined number of subPENTA video modules to form a three-dimensional construction of a bigPENTA video module, the projection of which on the plane comprises a triangular shape, and each subPENTA video module is located in space in such a way that the vertices of each subPENTA video module lie on the surface of the approximated sphere and to approximate the part of the sphere surface that corresponds to the projection of the subPENTA video module onto the surface of the approximated sphere, where the projection of the bigPENTA video module onto the plane is characterized by a triangular shape with two equal lateral sides and a base, and the projections of five bigPENTA video modules, characterized by a triangular shapes, connected to each other by the lateral sides, form the lateral surface of a regular straight pyramid, at the base of which is a regular pentagon, which consists of the five bases of the above projections of the bigPENTA video modules, and wherein the vertices of the specified pyramid lie on the surface of the approximated sphere, and the subHEXA video modules form a set of a predetermined number of subHEXA video modules to form a three-dimensional construction of the bigHEXA video module, the projection of which on the plane is characterized by a triangular shape, and each subHEXA video module is located in space in such a way that the vertices of each subHEXA video module lie on the surface of the sphere being approximated and to approximate the part of the surface of the sphere that corresponds to the projection of the subHEXA video module onto the surface of the approximated sphere, where the projection of the bigHEXA video module onto the plane is characterized by a triangular shape with two equal lateral sides and a base, and the projections of six big HEXA video modules, characterized by a triangular shapes, connected to each other by the lateral sides, form the lateral surface of a regular right pyramid, at the base of which is a regular hexagon, which consists of the six bases of the above projections of the bigHEXA video modules, and wherein the vertices of the specified pyramid lie on the surface of the approximated sphere, and each of at least one subPENTA video module and each of at least one subHEXA video module comprises at least one element for playing a video image on at least one of its surfaces, wherein at least one bigHEXA video module and at least one bigPENTA video module are aligned with each other by their bases, and wherein:

the screen size is increased by simultaneously adding:

to a subPENTA video module of a 1st type of modPENTA video modules of the 1st type of the same size, to a subPENTA video module of a 2nd type of modPENTA video modules of the 2nd type of the same size, to a subPENTA video module of a 3rd type of modPENTA video modules of the 3rd type of the same size, to a sub PENTA video module of a 4th type of modPENTA video modules of the 4th type of the same size, to a sub PENTA video module of a 5th type of modPENTA video modules of the 5th type of the same size, to a subHEXA video module of a 1st type of modHEXA video modules of the 1st type of the same size, to a subHEXA video module of a 2nd type of modHEXA video modules of the 2nd type of the same size, to a subHEXA video module of a 3rd type of modHEXA video modules of the 3rd type of the same size, to a subHEXA video module of a 4th type of modHEXA video modules of the 4th type of the same size, to a subHEXA video module of a 5th type of modHEXA video modules of the 5th type of the same size, where the addition is performed according to the formula:

$$Snext=(N+1)^2-N^2, \tag{1}$$

where N is an integer representing a degree of subdivision for subPENTA or subHEXA video modules, where $$N=\sqrt{Scur} \tag{2}$$

where Scur describes a number of modPENTA video modules in any subPENTA video module, or a number of modHEXA video modules in any subHEXA video module, and Snext is a number of modPENTA or modHEXA video modules that required to be added to each corresponding subPENTA or subHEXA video module of a spherical modular video screen of the degree of subdivision N, in order to obtain the next size of a spherical modular video screen, corresponding to the next degree of subdivision N, and the subPENTA video module consists only of identical modPENTA video modules of the corresponding type, and the subHEXA video module consists only of identical modHEXA video modules of the corresponding type.

2. The spherical modular video screen system of claim 1, wherein:

each subPENTA video module comprises multiple identical modPENTA video modules, each of which is characterized by a triangular shape, and the vertices of the modPENTA video modules lie on the surface of the approximated sphere, and the specified modPENTA video modules are mutually arranged in space in such a way as to approximate a part of the surface of the sphere, which corresponds to the projection of the subPENTA video module onto the surface of the approximated sphere, and each sub HEXA video module comprises multiple identical modHEXA video modules, each of which is characterized by a triangular shape, with the vertices of the modHEXA video modules lie on the surface of the approximated sphere, and the specified modHEXA video modules are mutually arranged in space in such a way as to approximate a part of the surface of the sphere, which corresponds to the projection of the subHEXA video module onto the surface of the approximated sphere.

3. The spherical modular video screen system of claim 2, wherein:

the bigPENTA video module comprises at least four subPENTA video modules connected to each other, the projection on the plane of each of which is characterized by a triangular shape, where each subPENTA video module has the first, second and third sides connected to each other, and when the specified subPENTA video modules are combined, the resulting structure is characterized by a projection onto the plane that coincides with the projection of the bigPENTA video module onto the same plane, which characterized by the first, second and third sides, and the bigHEXA video module comprises at least 4 connected to each other subHEXA video modules, the projection on the plane of each of which is characterized by a triangular shape, where each subHEXA video module has the first, second and third sides connected to each other, and when the specified subHEXA video modules are combined, the resulting structure is characterized by a projection onto the plane that coincides with the projection of the bigHEXA video module onto the same plane, which characterized by the first, second and third sides.

4. The spherical modular video screen system of claim 2, wherein:

the bigPENTA video module comprises at least nine subPENTA video modules, the projection on the plane of each of which is characterized by a triangular shape, where the nine subPENTA video modules are characterized as subPENTA video modules of the 1st type, the first and second of the 2nd type, the first, second and third of the 3rd type, the first and second of the 4th type, and of the 5th type, where each subPENTA video module has the first, second and third sides connected to each other, and when the specified subPENTA video modules are combined, the resulting structure is characterized by a projection onto a plane that coincides with the projection of a bigPENTA video module onto the same plane, characterized by the first, second and third sides, where on the projection the nine subPENTA video modules are interconnected as follows:

the third side of the projection of the third side of the projection of the first subPENTA video module of the 3rd type borders the third side of the projection of the second subPENTA video module of the 3rd type, and the first and second sides of the projection of the first subPENTA video module of the 3rd type at least partially coincide with the projections of the first and second sides of the bigPENTA video module, the first side of the projection of the second subPENTA video module of the 3rd type borders the second side of the projection of the first subPENTA video module of the 4th type, and the second side of the projection of the second subPENTA video module of the 3rd type borders the first side of the projection of the first subPENTA video module of the 2nd type, and the first side of the projection of the first subPENTA video module of the 4th type at least partially coincides with the first side of the projection of the bigPENTA video module, the second side of the projection of the first subPENTA video module of the 2nd type at least partially coincides with the second side of the bigPENTA video module, the third side of the projection of the first subPENTA video module of the 4th type borders the third side of the projection of the second subPENTA video module of the 2nd type, and the third side of the projection of the first subPENTA video module of the 2nd type borders the third side of the projection of the second subPENTA video module of the 4th type, the first side of the projection of the subPENTA video module of the 1st type at least partially coincides with the first side of the projection of the bigPENTA video module, the third side of the projection of the subPENTA video module of the 1st type at least partially coincides with the third side of the projection of the bigPENTA video module, the second side of the projection of the subPENTA video module of the 1st type borders the first side of the projection of the second subPENTA video module of the 2nd type, the second side of the projection of the second subPENTA video module of the 2nd type borders the first side of the projection of the third subPENTA video module of the 3rd type, the second side of the projection of the third subPENTA video module of the 3rd type borders the first side of the projection of the second subPENTA video module of the 4th type, the third side of the projection of the third subPENTA video module of the 3rd type at least partially coincides with the third side of the bigPENTA video module, the second side of the projection of the second subPENTA video module of the 4th type borders the first side of the projection of the subPENTA video module of the 5th type, the second side of the projection of the subPENTA video module of the 5th type at least partially coincides with the second side of the projection of the bigPENTA video module, the third side of the projection of the subPENTA video module of the 5th type at least partially coincides with the third side of the projection of the bigPENTA video module, and the bigHEXA video module comprises at least nine subHEXA video modules, the projection on the plane of each of which is characterized by a triangular shape, where the specified nine subHEXA video modules are characterized as subHEXA video modules of the 1st type, the first and second of the 2nd type, the first, second and third of the 3rd type, the first and second of the 4th type, and of the 5th type, where each subHEXA video module has the first, second and third sides connected to each other, and when the specified subHEXA video modules are combined, the resulting structure is characterized by a projection onto a plane that coincides with the projection of a bigHEXA video module onto the same plane, characterized by the first, second and third sides, where on the projection the nine subHEXA video modules are interconnected as follows:

the third side of the projection of the first subHEXA video module of the 3rd type borders the third side of the projection of the second subHEXA video module of the 3rd type, and the first and second sides of the projection of the first subHEXA video module of the 3rd type at least partially coincide with the projections of the first and second sides of the bigHEXA video module, the first side of the projection of the second subHEXA video module of the 3rd type borders the second side of the projection of the first subHEXA video module of the 4th type, and the second side of the projection of the second subHEXA video module of the 3rd type borders the first side of the projection of the first subHEXA video module of the 2nd type, and the first side of the projection of the first subHEXA video module of the 4th type at least partially coincides with the first side of the projection of the bigHEXA video module, the second side of the projection of the first subHEXA video module of the 2nd type at least partially coincides with the second side of the bigHEXA video module, the third side of the projection of the first subHEXA video module of the 4th type borders the third side of the projection of the second subHEXA video module of the 2nd type, and the third side of the projection of the first subHEXA video module of the 2nd type borders the third side of the projection of the second subHEXA video module of the 4th type, the first side of the projection of the subHEXA video module of the 1st type at least partially coincides with the first side of the projection of the bigHEXA video module, the third side of the projection of the subHEXA video module of the 1st type at least partially coincides with the third side of the projection of the bigHEXA video module, the second side of the projection of the subHEXA video module of the 1st type borders the first side of the projection of the second subHEXA video module of the 2nd type, the second side of the projection of the second subHEXA video module of the 2nd type borders the first side of the projection of the third subHEXA video module of the 3rd type, the second side of the projection of the third subHEXA video module of the 3rd type borders the first side of the projection of the second subHEXA video module of the 4th type, the third side of the projection of the third subHEXA video module of the 3rd type at least partially coincides with the third side of the bigHEXA video module, the second side of the projection of the second subHEXA video module of the 4th type borders the first side of the projection of the subHEXA video module of the 5th type, and the second side of the projection of the subHEXA video module of the 5th type at least partially coincides with the second side of the projection of the bigHEXA video module, the third side of the projection of the subHEXA video module of the 5th type at least partially coincides with the third side of the projection of the bigHEXA video module.

5. The spherical modular video screen of claim 4, wherein:

the subPENTA video module of the 1st type comprises at least 4 modPENTA video modules of the 1st type of the same size, the subPENTA video module of the 2nd type comprises at least 4 modPENTA video modules of the 2nd type of the same size, the subPENTA video module of the 3rd type comprises at least 4 modPENTA video modules of the 3rd type of the same size, the subPENTA video module of the 4th type comprises at least 4 modPENTA video modules of the 4th type of the same size, the subPENTA video module of the 5th type comprises at least 4 modPENTA video modules of the 5th type of the same size, and the subHEXA video module of the 1st type comprises at least 4 modHEXA video modules of the 1st type of the same size, the subHEXA video module of the 2nd type comprises at least 4 modHEXA video modules of the 2nd type of the same size, the subHEXA video module of the 3rd type comprises at least 4 modHEXA video modules of the 3rd type of the same size, the subHEXA video module of the 4th type comprises at least 4 modHEXA video modules of the 4th type of the same size, and the subHEXA video module of the 5th type comprises at least 4 modHEXA video modules of the 5th type of the same size.

6. A spherical modular video screen, comprising a plurality of video modules that are mounted on a frame, wherein a set of video modules includes:

at least 4 subPENTA video modules, each of which has a triangular shape and approximates a part of the surface of the sphere, which is determined by its three remote vertices, which lie on the surface of the approximated sphere, and the specified at least 4 subPENTA video modules are combined to form a bigPENTA video module, which has a triangular shape, where the part of the sphere approximated by the bigPENTA video module formed is defined by its three remote vertices that lie on the surface of this sphere and which coincide with the three remote vertices of the combined subPENTA video modules, where the specified at least 4 subPENTA video modules are combined into a bigPENTA video module, the vertices of which lie on the surface of the approximated sphere, at least 4 subHEXA video modules, each of which has a triangular shape and approximates a part of the surface of the sphere, which is determined by its three remote vertices, which lie on the surface of the approximated sphere, and the specified at least 4 subHEXA video modules are combined to form a big HEXA video module, which is has a triangular shape, where the part of the sphere approximated by the formed bigHEXA video module is determined by its three remote vertices, which lie on the surface of this sphere and which coincide with the three remote vertices of the combined subHEXA video modules, where the specified at least 4 subHEXA video modules are combined into a bigHEXA video module, the vertices of which lie on the surface of the approximated sphere, and wherein:

the screen size is increased by simultaneously adding:

to a subPENTA video module of a 1st type of modPENTA video modules of the 1st type of the same size, to a subPENTA video module of a 2nd type of modPENTA video modules of the 2nd type of the same size, to a subPENTA video module of a 3rd type of modPENTA video modules of the 3rd type of the same size, to a subPENTA video module of a 4th type of modPENTA video modules of the 4th type of the same size, to a subPENTA video module of a 5th type of modPENTA video modules of the 5th type of the same size, to a subHEXA video module of a 1st type of modHEXA video modules of the 1st type of the same size, to a sub HEXA video module of a 2nd type of modHEXA video modules of the 2nd type of the same size, to a subHEXA video module of a 3rd type of modHEXA video modules of the 3rd type of the same size, to a sub HEXA video module of a 4th type of modHEXA video modules of the 4th type of the same size, to a subHEXA video module of a 5th type of modHEXA video modules of the 5th type of the same size, where the addition is performed according to the formula:

$$Snext=(N+1)^2-N^2 \quad (1),$$

where N is an integer representing a degree of subdivision for subPENTA or subHEXA video modules, where $$N = \sqrt{Scur} \quad (2)$$

where Scur describes a number of modPENTA video modules in any subPENTA video module, or a number of modHEXA video modules in any subHEXA video module, and Snext is a number of modPENTA or modHEXA video modules that required to be added to each corresponding subPENTA or subHEXA video module of a spherical modular video screen of the degree of subdivision N, in order to obtain the next size of a spherical modular video screen, corresponding to the next degree of subdivision N, and the subPENTA video module consists only of identical modPENTA video modules of the corresponding type, and the subHEXA video module consists only of identical modHEXA video modules of the corresponding type.

7. The spherical modular video screen of claim 6, wherein:

six bigHEXA video modules are configured for combining with each other in such a way that six of their corresponding remote vertices are combined at one point, and each of the other two remote vertices of each bigHEXA video module is combined with a remote vertex of another adjacent bigHEXA video module, and the five bigPENTA video modules are configured for combining with each other in such a way that their five corresponding remote vertices are combined at one point, and each of the other two remote vertices of each bigPENTA video module is combined with the remote vertex of another adjacent bigPENTA video module, and in addition, at least one bigHEXA video module and at least one bigPENTA video module are adjacently connected on the frame.

8. A spherical modular video screen comprising a plurality of video modules that are mounted on a frame, wherein:

a set of video modules includes:

at least 9 subPENTA video modules, each of which is characterized by a triangular shape and approximates a part of the surface of the sphere, defined by its three remote vertices, which lie on the surface of the approximated sphere, and the specified at least 9 subPENTA video modules are combined to form a bigPENTA video module, which is characterized by a triangular shape, where the part of the sphere approximated by the generated bigPENTA video module is determined by its three remote vertices that lie on the surface of this sphere and which coincide with the three remote vertices of the combined subPENTA video modules, where the subPENTA video modules are divided into 5 types, and each type is characterized by the same dimensions within type, where the specified at least 9 subPENTA video modules are combined into a bigPENTA video module, the vertices of which lie on the surface of the approximated sphere, and the five bigPENTA video modules are configured for combining with each other in such a way that five of their respective remote vertices are combined at one point, and each of the other two remote vertices of each bigPENTA video module is combined with a remote vertex of another adjacent bigPENTA video module, at least 9 subHEXA video modules, each of which is characterized by a triangular shape and approximates a part of the surface of the sphere, defined by its three remote vertices, which lie on the surface of the approximated sphere, and the specified at least 9 subHEXA video modules are combined to form a bigHEXA video module, which is characterized by a triangular shape, where the part of the sphere approximated by the generated bigHEXA video module is determined by its three remote vertices, which lie on the surface of this sphere and which coincide with the three remote vertices of the combined subHEXA video modules, where the subHEXA video modules are divided into 5 types, and each type is characterized by the same dimensions within type, where the specified at least 9 video modules are combined into a bigHEXA video module, the vertices of which lie on the surface of the approximated sphere, and the six bigHEXA video modules are configured for combining with each other in such a way that six of their respective remote vertices are combined at one point, and each of the other two remote vertices of each bigHEXA video module combined with a remote vertex of another adjacent bigHEXA video module, and at least one bigHEXA video module and at least one bigPENTA video module are adjacently connected on the frame, wherein:

the screen size is increased by simultaneously adding:

to a subPENTA video module of a 1st type of modPENTA video modules of the 1st type of the same size, to a sub PENTA video module of a 2nd type of modPENTA video modules of the 2nd type of the same size, to a subPENTA video module of a 3rd type of modPENTA video modules of the 3rd type of the same size, to a subPENTA video module of a 4th type of modPENTA video modules of the 4th type of the same size, to a subPENTA video module of a 5th type of modPENTA video modules of the 5th type of the same size,
to a subHEXA video module of a 1st type of modHEXA video modules of the 1st type of the same size,
to a subHEXA video module of a 2nd type of modHEXA video modules of the 2nd type of the same size,
to a sub HEXA video module of a 3rd type of modHEXA video modules of the 3rd type of the same size,
to a subHEXA video module of a 4th type of modHEXA video modules of the 4th type of the same size,
to a subHEXA video module of a 5th type of modHEXA video modules of the 5th type of the same size,
where the addition is performed according to the formula:

$$Snext=(N+1)^2-N^2, \quad (1)$$

where N is an integer representing a degree of subdivision for subPENTA or subHEXA video modules, where $$N=\sqrt{Scur} \quad (2)$$

where Scur describes a number of modPENTA video modules in any subPENTA video module, or a number of modHEXA video modules in any subHEXA video module, and
Snext is a number of modPENTA or modHEXA video modules that required to be added to each corresponding subPENTA or subHEXA video module of a spherical modular video screen of the degree of subdivision N, in order to obtain the next size of a spherical modular video screen, corresponding to the next degree of subdivision N,
and the subPENTA video module consists only of identical modPENTA video modules of the corresponding type, and the subHEXA video module consists only of identical modHEXA video modules of the corresponding type.

9. A spherical modular video screen comprising a plurality of video modules that are mounted on a frame, wherein:
a set of video modules includes:
at least 4 modPENTA video modules, each of which has a triangular shape and approximates a part of the surface of the sphere, which is determined by its three remote vertices, which lie on the surface of the approximated sphere, and the specified at least 4 modPENTA video modules are combined to form a subPENTA video module, which has a triangular shape, where the part of the sphere approximated by the generated subPENTA video module is determined by its three remote vertices that lie on the surface of this sphere and which coincide with the three remote vertices of the combined modPENTA video modules,
and wherein the spherical modular video screen is configured for increasing the number of modPENTA video modules in each of the subPENTA video modules while preserving the proportions of the sides of the subPENTA video module in such a way that the three remote vertices of the subPENTA video module coincide with the three remote vertices of the combined modPENTA video modules,
at least 9 subPENTA video modules, each of which has a triangular shape and approximates a part of the surface of the sphere, defined by its three remote vertices, which lie on the surface of the approximated sphere, and the specified at least 9 subPENTA video modules are combined to form a big PENTA video module, which has a triangular shape, where the part of the sphere approximated by the generated bigPENTA video module is determined by its three remote vertices that lie on the surface of this sphere and which coincide with the three remote vertices of the combined subPENTA video modules, where the subPENTA video modules are divided into 5 types, and each type is characterized by the same dimensions within type,
where the specified at least 9 subPENTA video modules are combined into a bigPENTA video module, the vertices of which lie on the surface of the approximated sphere, and the five bigPENTA video modules are configured such that five of their respective remote vertices are combined at one point, and each of the other two remote vertices of each bigPENTA video module is combined with a remote vertex of another adjacent bigPENTA video module,
at least 4 modHEXA video modules, each of which is characterized by a triangular shape and approximates a part of the surface of the sphere, defined by its three remote vertices, which lie on the surface of the approximated sphere, and said at least 4 modHEXA video modules are combined to form a subHEXA video module, which is characterized by a triangular shape, where the part of the sphere approximated by the generated subHEXA video module is determined by its three remote vertices, which lie on the surface of this sphere and which coincide with the three remote vertices of the combined modHEXA video modules,
and the spherical modular video screen is configured for simultaneously increasing the number of modHEXA video modules in each of the subHEXA video modules while preserving the proportions of the sides of the subHEXA video module in such a way that the three remote vertices of the subHEXA video module coincide with the three remote vertices of the combined modHEXA video modules,
at least 9 subHEXA video modules, each of which is characterized by a triangular shape and approximates a part of the surface of the sphere, defined by its three remote vertices, which lie on the surface of the approximated sphere, and the specified at least 9 subHEXA video modules are combined to form a bigHEXA video module, which is characterized by a triangular shape, where the part of the sphere approximated by the generated bigHEXA video module is determined by its three remote vertices, which lie on the surface of this sphere and which coincide with the three remote vertices of the combined sub HEXA video modules, where the subHEXA video modules are divided into 5 types, and each type is characterized by the same dimensions within type,
where the specified 9 subHEXA video modules are combined into a bigHEXA video module, the vertices of which lie on the surface of the approximated sphere, and the six bigHEXA video modules are configured for combining with each other in such a way that six of their corresponding remote vertices are combined at one point, and each of the other two remote vertices of each bigHEXA video module combined with a remote vertex of another adjacent bigHEXA video module, and wherein at least one bigHEXA video module and at least one bigPENTA video module are adjacently connected on the frame, wherein:

the screen size is increased by simultaneously adding:

to a subPENTA video module of a 1st type of modPENTA video modules of the 1st type of the same size, to a subPENTA video module of a 2nd type of modPENTA video modules of the 2nd type of the same size, to a subPENTA video module of a 3rd type of modPENTA video modules of the 3rd type of the same size, to a subPENTA video module of a 4th type of modPENTA video modules of the 4th type of the same size, to a subPENTA video module of a 5th type of modPENTA video modules of the 5th type of the same size, to a sub HEXA video module of a 1st type of modHEXA video modules of the 1st type of the same size, to a subHEXA video module of a 2nd type of modHEXA video modules of the 2nd type of the same size, to a sub HEXA video module of a 3rd type of modHEXA video modules of the 3rd type of the same size, to a subHEXA video module of a 4th type of modHEXA video modules of the 4th type of the same size, to a sub HEXA video module of a 5th type of modHEXA video modules of the 5th type of the same size, where the addition is performed according to the formula:

$$Snext = (N+1)^2 - N^2, \tag{1}$$

where N is an integer representing a degree of subdivision for subPENTA or subHEXA video modules, where $$N = \sqrt{Scur} \tag{2}$$

where Scur describes the number of modPENTA video modules in any subPENTA video module, or the number of modHEXA video modules in any subHEXA video module, and Snext is a number of modPENTA or modHEXA video modules that required to be added to each corresponding subPENTA or subHEXA video module of a spherical modular video screen of the degree of subdivision N, in order to obtain the next size of a spherical modular video screen, corresponding to the next degree of subdivision N, and the subPENTA video module consists only of identical modPENTA video modules of the corresponding type, and the subHEXA video module consists only of identical modHEXA video modules of the corresponding type.

* * * * *